United States Patent
Saitoh et al.

(10) Patent No.: US 8,076,231 B2
(45) Date of Patent: Dec. 13, 2011

(54) SEMICONDUCTOR DEVICE AND MANUFACTURING METHOD OF SAME

(75) Inventors: Masumi Saitoh, Kanagawa (JP); Ken Uchida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 380 days.

(21) Appl. No.: 12/401,704

(22) Filed: Mar. 11, 2009

(65) Prior Publication Data

US 2009/0242990 A1 Oct. 1, 2009

(30) Foreign Application Priority Data

Mar. 28, 2008 (JP) ................................. 2008-085905

(51) Int. Cl.
*H01L 21/4763* (2006.01)
(52) U.S. Cl. ........ 438/592; 257/347; 257/353; 257/618; 257/628; 257/E21.377; 438/153; 438/154; 438/585
(58) Field of Classification Search ............. 257/347, 257/351, 353, 521, 527, 618, 623, 627, 628; 257/E21.377; 438/153, 154, 585, 592, 978
See application file for complete search history.

(56) References Cited

U.S. PATENT DOCUMENTS

| 7,564,081 | B2 | 7/2009 | Zhu et al. | |
|---|---|---|---|---|
| 7,812,398 | B2 * | 10/2010 | Saito et al. | 257/347 |
| 2007/0190708 | A1 | 8/2007 | Kaneko et al. | |
| 2007/0210355 | A1 | 9/2007 | Izumida | |

FOREIGN PATENT DOCUMENTS

| JP | 2007-158329 | 6/2007 |
|---|---|---|
| JP | 2007-207837 | 8/2007 |

OTHER PUBLICATIONS

K. Ota, et al., "Novel Locally Strained Channel Technique for High Performance 55nm CMOS", Technical Digest of International Electron Devices Meeting (IEDM), 2002, 4 pages.

* cited by examiner

*Primary Examiner* — Evan Pert
*Assistant Examiner* — Eduardo A Rodela
(74) *Attorney, Agent, or Firm* — Oblon, Spivak, McClelland, Maier & Neustadt, L.L.P.

(57) ABSTRACT

A FinFET and nanowire transistor with strain direction optimized in accordance with the sideface orientation and carrier polarity and an SMT-introduced manufacturing method for achieving the same are provided. A semiconductor device includes a pMISFET having a semiconductor substrate, a rectangular solid-shaped semiconductor layer formed at upper part of the substrate to have a top surface parallel to a principal plane of the substrate and a sideface with a (100) plane perpendicular to the substrate's principal plane, a channel region formed in the rectangular semiconductor layer, a gate insulating film formed at least on the sideface of the rectangular layer, a gate electrode on the gate insulator film, and source/drain regions formed in the rectangular semiconductor layer to interpose the channel region therebetween. The channel region is applied a compressive strain in the perpendicular direction to the substrate principal plane. A manufacturing method of the device is also disclosed.

12 Claims, 18 Drawing Sheets

(100)Sideface FinFET

P-channel FinFET

N-channel FinFET (110)Sideface FinFET

N-channel FinFET

P-channel FinFET (100)Sideface FinFET

P-channel FinFET

N-channel FinFET

SEMICONDUCTOR DEVICE AND MANUFACTURING METHOD OF SAME

CROSS-REFERENCE TO RELATED APPLICATION(S)

This application is based upon and claims priority to Japanese Patent Application No. 2008-085905, filed Mar. 28, 2008, the entire contents of which are incorporated herein by reference.

TECHNICAL FIELD

Examplary embodiments described herein relates to semiconductor devices having "fin" type channel transistors or nano-wire channel transistors and manufacturing methodology of the devices.

BACKGROUND

A fin channel MISFET (FinFET) structure and nano-wire channel transistor (nanowire transistor) with enhanced tolerance against short-channel effects are expected to be used as a device structure for realizing ultra-highly scaled down metal insulator semiconductor field effect transistors (MISFETs) with gate length of 30 nanometers (nm) or less. The FinFET is designed, for example, to have on a silicon substrate a rectangular solid-shaped semiconductor layer, one part of which is used as a channel region. On both side faces of this channel region, a gate electrode is formed so that thin channel region is interposed therebetween. This gate electrode is structured to surround the channel region; so, the gate controllability is improved, and the short-channel effect tolerance is enhanced.

A nanowire transistor is similar in structure to the FinFET with the rectangular solid-shaped semiconductor layer being reduced in height and also with the gate electrode being also provided on a top surface of the rectangular solid-like semiconductor layer. In the nanowire transistor, the top surface of the rectangular semiconductor layer also operates as the channel. A nanowire transistor having its rectangular semiconductor layer of a relatively large size is also called the "tri-gate" transistor.

On the other hand, in order to improve the operation speed of the existing planar MISFETs, there is a technique for introducing crystal lattice distortion or strain into a channel from a gate electrode. This is known as the gate-induced strain technique, which is disclosed in K. Ota et al., "Novel Locally Strained Channel Technique for High Performance 55 nm CMOS," IEDM Tech. Digest, pp. 27-30 (2002). For example, a chosen impurity, such as phosphorus (P), arsenic (As), germanium (Ge) or else, is heavily doped into a polycrystalline silicon (poly-Si) gate electrode to a high concentration and form a stress liner nitride film on the poly-Si gate electrode. While this high concentration impurity doping results in the poly-Si gate electrode being converted to an amorphous state, i.e., amorphasized, it must experience crystallization during annealing at high temperatures so that volume expansion takes place. As the volume expansion of the poly-Si gate electrode is suppressed by the presence of its overlying stress liner nitride film, a compressive stress is accumulated in the poly-Si gate electrode. The stress linear nitride film is removed away after completion of the annealing process. However, even after this film removal, the compressive stress that was generated in the poly-Si gate electrode continues to exist in the form of a grain size(s).

Upon occurrence of the compressive stress in the poly-Si gate electrode, a compressive strain is induced in the channel region in a direction at right angles to the substrate whereas an extensional or tensile strain is induced in a direction along the gate length. The strain in this direction contributes to an improvement in performance of n-channel MISFETs (nMISFETs); so, attempts are vigorously made to introduce it into nMISFETs. Note however that no such attempts result in improvement in performance of p-channel MISFETs (pMISFETs). This method is called the stress memorization technique (SMT) in light of its feature that a stress is left or "memorized" in the poly-Si gate electrode even after having removed the stress linear nitride film.

In the sub-30 nm generation of device technology, it is considered desirable to apply the SMT to FinFETs or nanowire transistors. However, there has not been given any definite guideline for the strain to be applied to the channel region of a FinFET or a nanowire transistor in order to improve the transistor characteristics. Accordingly, the SMT that is best suited for FinFETs or nanowire transistors is not yet established until today.

SUMMARY

In accordance with a first aspect of the present disclosure, a semiconductor device is provided, which includes a semiconductor substrate, a rectangular solid-shaped semiconductor layer formed at an upper part of the semiconductor substrate to have a top surface being parallel to a principal plane of the semiconductor substrate and a side face with a (100) plane perpendicular to the principal plane of the semiconductor substrate, and a p-channel MISFET (pMISFET). The pMISFET has a channel region formed at least at the side face of the rectangular solid-shaped semiconductor layer, a gate dielectric film formed at least on the side face of the rectangular solid-shaped semiconductor layer, a gate electrode covering the channel region with the gate dielectric film being sandwiched therebetween, and a pair of source and drain regions formed within the rectangular solid-shaped semiconductor layer in such a way as to interpose the channel region therebetween. The channel region is applied with a compressive strain in a direction perpendicular to the principal plane of the semiconductor substrate.

In accordance with a second aspect of this disclosure, a semiconductor device includes a semiconductor substrate, a first and a second spaced-apart rectangular solid-shaped semiconductor layers, a pMISFET which is provided at the first rectangular semiconductor layer, and an nMISFET at the second rectangular semiconductor layer. The first and second rectangular layers are formed at an upper part of the semiconductor substrate. Each of these layers has a top surface that is parallel to a principal plane of the semiconductor substrate and a side face with a (110) plane perpendicular to the principal plane of the semiconductor substrate. The pMISFET has a channel region which is formed at least at the side face of the first rectangular semiconductor layer, a gate dielectric film which is formed at least on the side face of the first rectangular semiconductor layer, a gate electrode covering the channel region with the gate dielectric film being sandwiched therebetween, and a pair of source and drain regions formed within the first rectangular semiconductor layer in such a way as to interpose the channel region therebetween. The nMISFET has a channel region which is formed at least at the side face of the second rectangular semiconductor layer, a gate dielectric film which is formed at least on the side face of the second rectangular semiconductor layer, a gate electrode covering the channel region with the gate dielectric film being sandwiched therebetween, and a pair of source/drain regions formed within the second rectangular semiconductor layer in such a way as to interpose the channel region therebetween. This channel region of the nMISFET is applied a compressive strain in a direction perpendicular to the principal plane of the semiconductor substrate.

A manufacturing method of the semiconductor device in accordance with the third aspect of this disclosure includes the steps of forming a plurality of rectangular solid-shaped semiconductor layers at an upper part of a semiconductor substrate, forming a gate dielectric film at least on side faces of the rectangular solid-shaped semiconductor layers, forming a metal film on the gate dielectric film, depositing on or above the metal film a semiconductor film in such a way as to fill a portion between adjacent ones of the rectangular solid-shaped semiconductor layers, performing impurity doping by ion implantation to change an upper part of the semiconductor film to an amorphous material, patterning the semiconductor film and the metal film to thereby form a gate electrode, forming a stress liner dielectric film on or above the gate electrode, performing thermal processing for crystallizing the upper part of the semiconductor film, and removing the stress liner dielectric film.

A manufacturing method of the semiconductor device in accordance with the fourth aspect of the disclosure includes the steps of forming a plurality of rectangular solid-shaped semiconductor layers at an upper part of a semiconductor substrate, forming a gate dielectric film at least at side faces of the rectangular solid-shaped semiconductor layers, forming a metal film on the gate dielectric film in such a way as to fill a portion between adjacent ones of the rectangular solid-shaped semiconductor layers, planarizing the metal film by polishing, depositing a semiconductor film on or above the metal film, performing impurity doping by ion implantation to amorphasize an upper part of the semiconductor film, patterning the semiconductor film and the metal film to thereby form a gate electrode, forming a stress liner dielectric film on the gate electrode, performing thermal processing for crystallizing the upper part of the semiconductor film, and removing the stress liner dielectric film.

According to this disclosure, it becomes possible to provide a FinFET and nanowire transistor with a strain direction being optimized in compliance with the sideface crystal orientation and the carrier polarity and also an SMT-introduced manufacturing method for achieving the same.

DETAILED DESCRIPTION OF THE EMBODIMENTS

Figure 1:
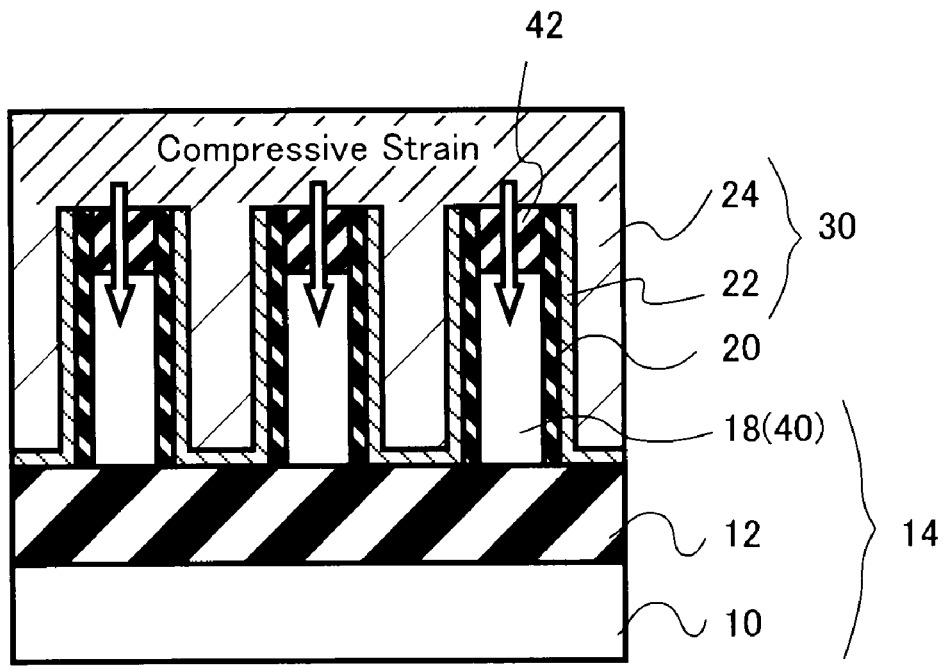
FIG. 1 is a diagram schematically showing a cross-sectional view of a semiconductor device in accordance with a first embodiment.

Several embodiments will be described with reference to the accompanying figures of the drawing below. In the description below, the notations "(100) plane" and "(110) plane" will be used as representative indications of {100} planes and {110} planes, respectively. The notations "<100> direction" and "<110> direction" will be used as representations of crystallographically equivalent directions of [100] directions and [110] directions, respectively.

In addition, in the description below, the term "gate length direction" is used to refer to the direction of a flow of electrical charge carriers, which are electrons or holes. The term "gate length" means the length of a gate electrode in the gate length direction. Additionally, in this description, the term "rectangular solid-shaped semiconductor width" refers to the thickness of a rectangular solid-shaped semiconductor layer of a channel region. The term "height of rectangular solid-shaped semiconductor layer" means the distance of from a bottom face to a top surface of the rectangular solid-shaped semiconductor layer.

Also note that in this description, the expression "(100) plane direction," for example, is not exclusively limited to the case where the surface of a semiconductor is perfectly identical to the (100) plane but may also include those cases where the semiconductor surface has an oblique angle of about ±5 degrees with respect to the (100) plane. The same goes with the representations of "<100> direction" and "<110> direction." Reasons of this inclusion of the angle range of ±5 degrees are as follows: first, in the manufacture of semiconductor devices, it is difficult in a viewpoint of the accuracy to achieve perfect coincidence of directions and crystal planes;

second, within the angular error range of about ±5 degrees, it is possible to obtain the intended functions and effects of this disclosure.

Figure 2:
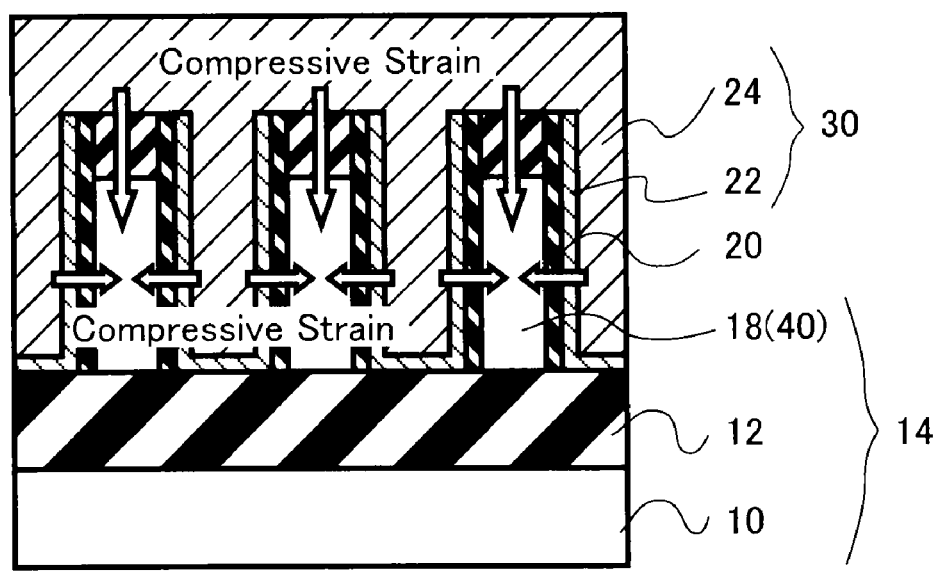
FIG. 2 is a diagram pictorially showing a sectional view of an SMT-introduced FinFET structure as has been applied to planar MOSFETs.

FIG. 2 is a diagram schematically showing a cross-section of FinFET with introduction of the stress memorization technique (SMT) that has traditionally been employed for planar MISFETS, wherein the cross-section is at right angles to the gate length direction of the FinFET. This SMT-introduced FinFET has a semiconductor substrate 14 which is formed by a substrate silicon 10 and a buried dielectric film 12 plus a silicon-on-insulator (SOI) layer thereon, a channel region 18 which is formed in a rectangular solid-shaped semiconductor layer 40 at an upper part of this semiconductor substrate 14, a gate insulating film 20 which is formed on side faces of this channel region 18, a gate electrode 30 which is formed on this gate insulator film 20 to have a multilayered structure of a metal film 22 and a poly-silicon film 24, and a pair of source and drain regions (not shown) which are formed to interpose the channel region 18 therebetween.

In the poly-silicon film 24, a chosen impurity, e.g., P, As, Ge or else, is heavily doped by ion implantation to a high concentration. As a compressive stress is accumulated in the poly-Si film 24 by a similar mechanism to the case of planar MISFETs, compressive strains are induced in the channel region 18 of the rectangular solid-shaped semiconductor layer 40, one of which is in a direction perpendicular to a principal plane of the semiconductor substrate 14, and the others of which are in a direction at right angles to sidefaces of the rectangular semiconductor layer 40 as indicated by white arrows in FIG. 2.

Figure 3:
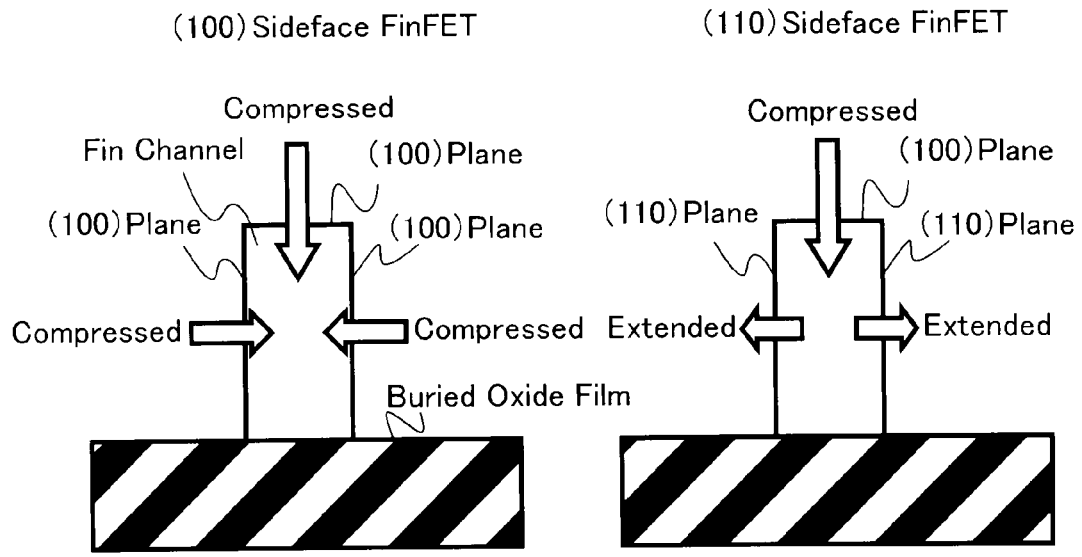
FIG. 3 is a pictorial representation of optimal stress directions in an n-channel FinFET.
Figure 4:
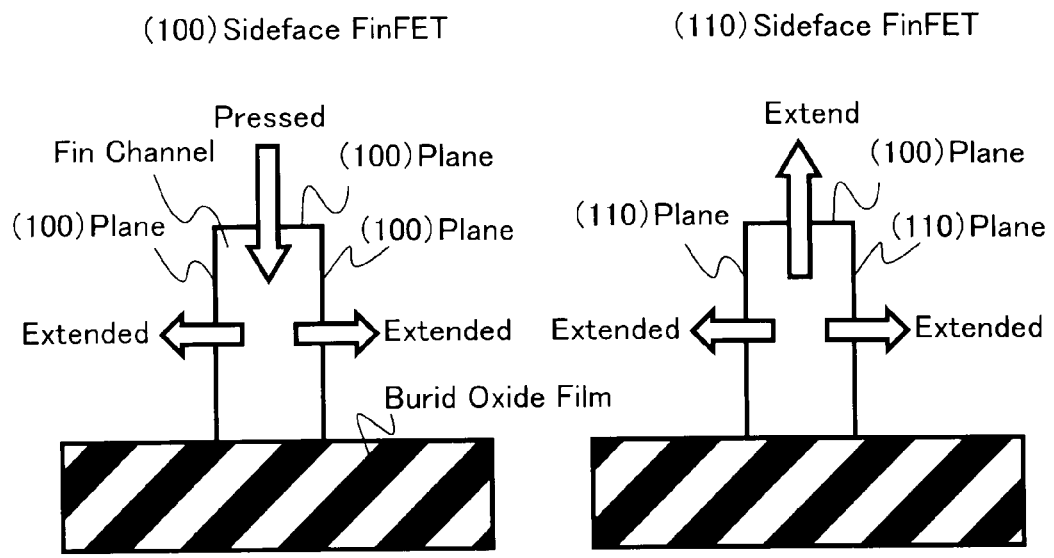
FIG. 4 is a pictorial representation of optimal stress directions in a p-channel FinFET.

To investigate and verify whether strains that are generated in the channel region in the structure of FIG. 2 bring an improvement in performance of FinFET, the inventors have measured a change in carrier mobility when actually introducing into FinFET the strains of respective directions. This experimentation was done by a method of bending a substrate with FinFET(s) being fabricated thereon to thereby mechanically introduce strains in the channel region of the FinFET. FIGS. 3 and 4 are diagrams showing results of this experiment. More specifically, these are pictorial drawings showing the optimum strain direction for bringing performance improvements in an n-channel FinFET and a p-channel FinFET. FIG. 3 is in the case of the n-channel FinFET, and FIG. 4 is the case of the p-channel FinFET.

In cases where a FinFET is formed on a semiconductor substrate having its surface with a (100) plane orientation, there are considered a case where the sideface of a rectangular solid-like semiconductor layer has a (110) plane and a case where it has a (100) plane. Respective plane orientations are different in direction of the strain that brings performance improvement. Additionally, in the case of a sideface of the (110) plane, the gate length direction becomes a <110> direction; in the case of a sideface of the (100) plane, the gate length direction becomes a <100> direction.

In n-channel FinFETs of FIG. 3, in the case of the (100)-plane sideface FinFET, any one of the compressive strain in the direction perpendicular to the substrate and the compressive strain in the perpendicular direction to the sideface of a rectangular semiconductor layer improves the performance so that it is considered that the strain induced by SMT shown in FIG. 2 brings significant performance improvement. However, in the case of the (110) sideface FinFET, the compressive strain in the perpendicular direction to the sideface of the rectangular semiconductor layer is rather disadvantageous although the compressive strain in the perpendicular direction to the semiconductor substrate's principal plane is advantageous. Thus, it is considered that the performance improvement by means of the SMT is kept less.

In p-channel FinFETs of FIG. 4, in the case of a (100) sideface FinFET, the compressive strain in the perpendicular direction to the substrate is advantageous in a similar way to the n-channel type (110) sideface FinFET. In contrast, the compressive strain in the perpendicular direction to the sideface of rectangular semiconductor layer is rather disadvantageous. For this reason, the SMT-based performance improvement is thought to be less. In the case of a (110) sideface FinFET, both the compressive strain in the perpendicular direction to substrate and the compressive strain in the perpendicular direction to the sideface of rectangular semiconductor layer are disadvantageous; so, it is predicted that the transistor performance is degraded by the SMT.

Figure 5:
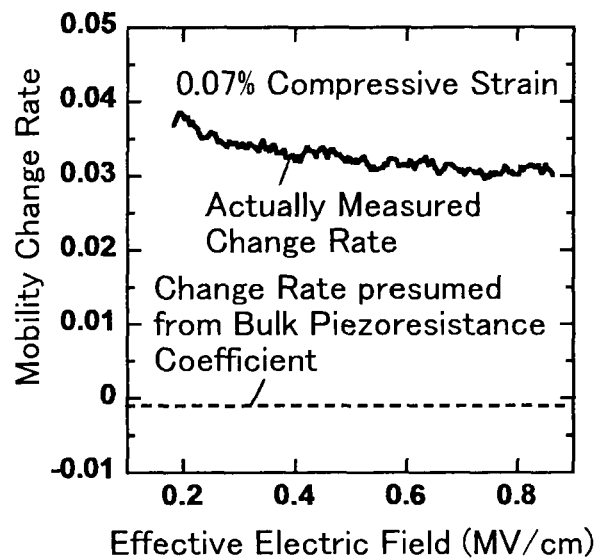
FIG. 5 is a diagram for explanation of a manufacturing method of the semiconductor device of the first embodiment.

As well, the fact that the only the compressive strain in the direction perpendicular to the principal plane of the semiconductor substrate yields performance improvement in the p-channel (100) sideface FinFET is the knowledge that is never predictable from the traditional bulk silicon's piezoelectric resistance coefficient and is the one that was first revealed by inventor's experimentation for introducing mechanical strains into the actual FinFET. FIG. 5 is a graph showing a measurement result of the mobility change rate upon introduction of the compressive strain in the perpendicular direction to the semiconductor substrate principal plane in the p-channel (100) sideface FinFET. In the experiment using FinFET, a positive mobility change rate was obtained, which is much greater than that forecasted from the bulk piezoresistance coefficient.

The obtainability of such significant performance improvement in the case of introducing the SMT into FinFET in this way is limited to the case of a specific sideface orientation and carrier polarity. Accordingly, in order to realize a high-performance FinFET, in particular, high-performance complementary FinFET, it is needed to introduce a "special" device structure capable of optimizing the direction of a strain to be induced by SMT in accordance with the sideface orientation and the carrier polarity. This is not exclusively limited to FinFETs, and the same goes with the nano-wire transistors also.

Embodiments, which employ the above-noted finding and knowledge as has been obtained by the inventors of this invention, will be explained with reference to the accompanying drawings below.

First Embodiment

A semiconductor device in accordance with this embodiment is arranged to include a semiconductor substrate, a rectangular solid-shaped semiconductor layer which is formed at an upper part of the semiconductor substrate and which has a top surface being parallel to a principal plane of the semiconductor substrate and a side face with a (100) plane perpendicular to the principal plane of the semiconductor substrate, and a p-channel metal insulator semiconductor field effect transistor (pMISFET). The pMISFET has a channel region which is formed at least at the side face of the rectangular solid-shaped semiconductor layer, a gate dielectric film which is formed at least on the sideface of the rectangular solid-shaped semiconductor layer, a gate electrode covering the channel region with the gate dielectric film being sandwiched therebetween, and a pair of source/drain regions formed within the rectangular solid-shaped semiconductor layer in such a manner as to interpose the channel region therebetween. The channel region is applied with a compressive strain in a direction perpendicular to the principal plane of the semiconductor substrate.

Figure 6:
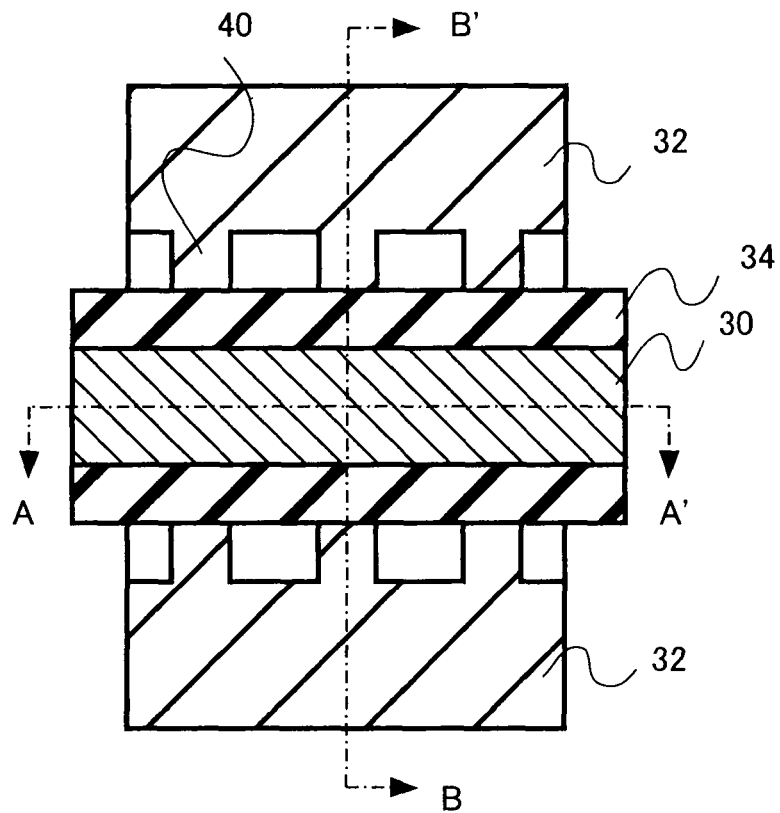
FIG. 6 is a diagram schematically showing a top plan view of the semiconductor device of the first embodiment.
Figure 7:
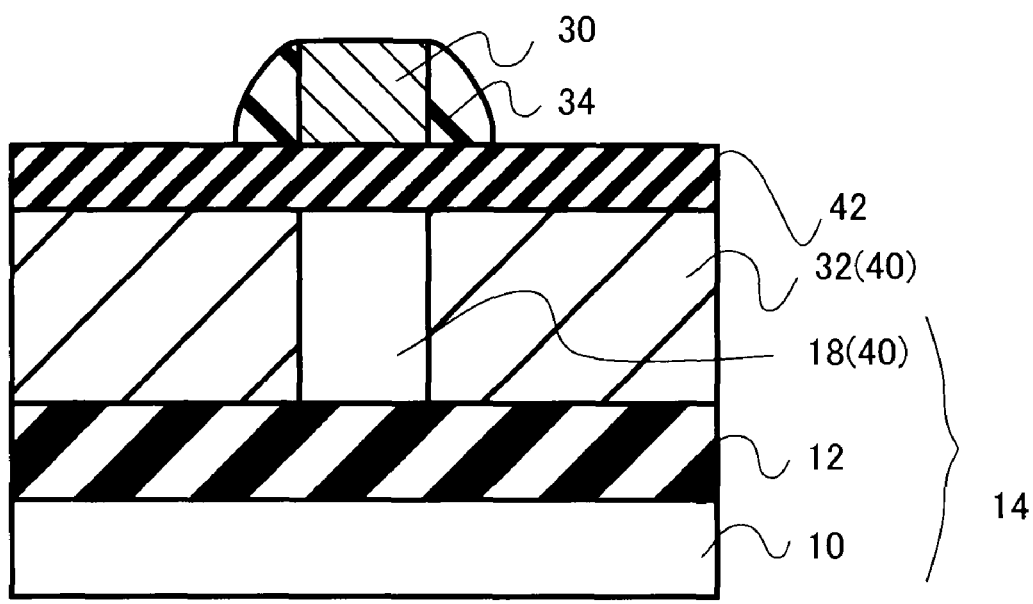
FIG. 7 is a schematic cross-sectional view of the semiconductor device of the first embodiment.

FIG. 6 is a diagram showing a top plan view of the semiconductor device of this embodiment. FIG. 1 is a diagram schematically showing a cross-section of the device of FIG. 6 as taken along line A-A'. FIG. 7 shows a cross-section taken along line B-B' of FIG. 6.

As shown in the schematic sectional view of FIG. 1, this semiconductor device is formed on an SOI substrate 14 having a substrate silicon 10 and a buried oxide film 12 thereon. The device has a rectangular solid-shaped semiconductor layer 40 which is formed at upper part of the SOI substrate 14 and which has a top surface extending in parallel to the SOI substrate 14 and side faces with a (100) crystal plane that is perpendicular to the SOI substrate 14, a channel region 18 which is formed at least at sidefaces of the rectangular semiconductor layer 40, a gate insulating film 20 which is formed on the sidefaces of the rectangular semiconductor layer 40 with the channel region 18 being formed therein and sidefaces of a hard mask layer 42, and a gate electrode 30 which covers the channel region 18 with the gate insulator film 20 being sandwiched therebetween. The gate electrode 30 has a multilayered structure of a metal film 22 and a poly-silicon film (semiconductor film) 24 that contains therein a chosen impurity, such as phosphorus (P) as an example. The poly-Si film 24 extends to fill a portion between adjacent ones of parallel semiconductor layers 40.

Figure 8:
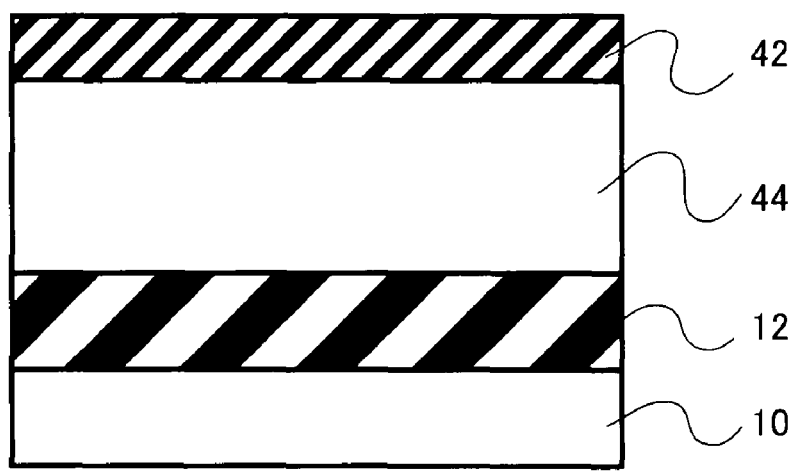
FIG. 8 is a schematic sectional diagram showing the manufacturing method of the semiconductor device of the first embodiment.

As shown in FIG. 7, a pair of source and drain regions 32 with boron (B) being doped therein as an impurity for example are provided in the rectangular semiconductor layer 40, which are formed in such a manner as to interpose the channel region 18 therebetween. Further, as shown in FIG. 6 or 8, a gate electrode 30 and sidewall dielectric films 34 on both sides thereof are formed so that these vertically cross the plurality of rectangular semiconductor layers 40. In this way, the semiconductor device of this embodiment is a p-channel SOI-FinFET of the so-called double gate structure type.

In this FinFET, the poly-Si film 24 of gate electrode 30 is not uniform in impurity concentration. The impurity concentration becomes higher in a direction toward upside from the lowermost layer of the poly-Si film 24 of gate electrode 30, i.e., the SOI substrate 14 side. Owing to this variable impurity concentration feature, the poly-Si film 24 is such that the impurity concentration in a region above the height of an upper surface of the channel region 18 becomes higher than the impurity concentration at the height of the top surface of the rectangular semiconductor layer 40, i.e., the upper surface of channel region 18.

By arranging the poly-Si film 24 so that the impurity concentration of the region at both sidefaces of the channel region 18 is lowered while at the same time increasing the impurity concentration of the region at upside of the channel region 18 in this way, amorphasization of the poly-Si film 24 and volume expansion in SMT process take place appreciably only in the region on upside of the channel region 18. Accordingly, a compressive strain is induced only in the direction perpendicular to the SOI substrate 14 (strain amount of 0.05% or greater) whereas no compressive strains are induced in the direction perpendicular to the sidefaces of rectangular semiconductor layer 40 (strain amount of less than or equal to 0.05%). Note here that the strain amount $\epsilon$ is defined by $\epsilon=(a-a_0)/a_0$, where $a_0$ is the lattice distance of a crystal in the absence of any strains, and "a" is the crystal lattice distance after having added strains thereto. The strain amount can typically be evaluated by Raman spectrometric measurement, also known as Raman spectroscopy.

As can be seen from FIG. 4, according to the p-channel FinFET (pFinFET) of this embodiment, the mobility of charge carriers is improved. Thus it is possible to achieve pFinFET with an increased drive current amount.

It should be noted here that preferable examples of the impurity to be contained in the poly-Si film 24 of gate electrode 30 include, but not limited to, phosphorus (P), arsenic (As) or germanium (Ge), which causes amorphasization of poly-Si by ion implantation in the process of manufacturing the semiconductor device. In the region above the height of the upper face of the channel region 18 including the uppermost layer within the poly-Si film 24, the impurity concentration is preferably set to be greater than or equal to $2\times10^{20}$ cm$^{-3}$ and less than or equal to $2\times10^{21}$ cm$^{-3}$. This value setting is in order to avoid an excessive increase in ion implantation damage as given to the gate insulator film 20 and/or the gate electrode 30 during ion implantation while inducing sufficient degrees of amorphasization and volume expansion. In addition, the impurity concentration of the lowermost layer of the poly-Si film 24 is preferably set so that it is greater than or equal to $2\times10^{19}$ cm$^{-3}$ and less than $2\times10^{20}$ cm$^{-3}$ in order to suppress the amorphasization and volume expansion in the regions at both sidefaces of rectangular semiconductor layer 40 while at the same time avoiding an excessive increase in gate resistance.

In order to increase the current amount, it is desirable that more than two rectangular semiconductor layers 40 (channel regions 18) be laid out in parallel with each other as shown in FIG. 1 or 6. At this time, the layout interval or "pitch" of these rectangular semiconductor layers is preferably set to 10 nm or more in order to avoid an increase in resistance of the gate electrode 30 to be formed between adjacent ones of the rectangular semiconductor layers and is desirably less than or equal to 250 nm in order to increase the current amount. Note that the use of this layout of such plurality of rectangular semiconductor layers is not necessarily essential to the inventive concept as disclosed herein.

Additionally, examples of the material of the metal film 22 of gate electrode 30 are a metal silicide, titanium nitride (TiN), tungsten (W), tantalum carbide (TaC) and others.

Additionally, the buried oxide film 12 is preferably arranged to have a thickness of 5 nm or more and yet less than or equal to 200 nm in order to avoid an excessive increase in capacitance between the channel and substrate while at the same time strengthening the durability against short-channel effects.

The height of the poly-Si film 24 of gate electrode 30 from the top surface of hard mask layer 42 is preferably set to 10 nm or more and yet less than or equal to 200 nm in order to avoid an excessive increase in gate resistance while retaining controllability in the process of etching the gate electrode.

The height of the rectangular semiconductor layer(s) 40 is preferably set at 3 nm or more and yet less than or equal to 100 nm in order to avoid an excessive decrease in carrier mobility while retaining the controllability at the time of etching the rectangular semiconductor layer(s).

In order to obtain enhanced short-channel effect tolerance, the width of a rectangular semiconductor layer, i.e., the thickness of rectangular semiconductor layer 40 of channel region 18 is desirably set to less than or equal to L/2, where L is the gate length. On the other hand, from a view point of avoiding an excessive decrease in carrier mobility, the rectangular semiconductor layer width is desirably set at 3 nm or more.

Figure 9:
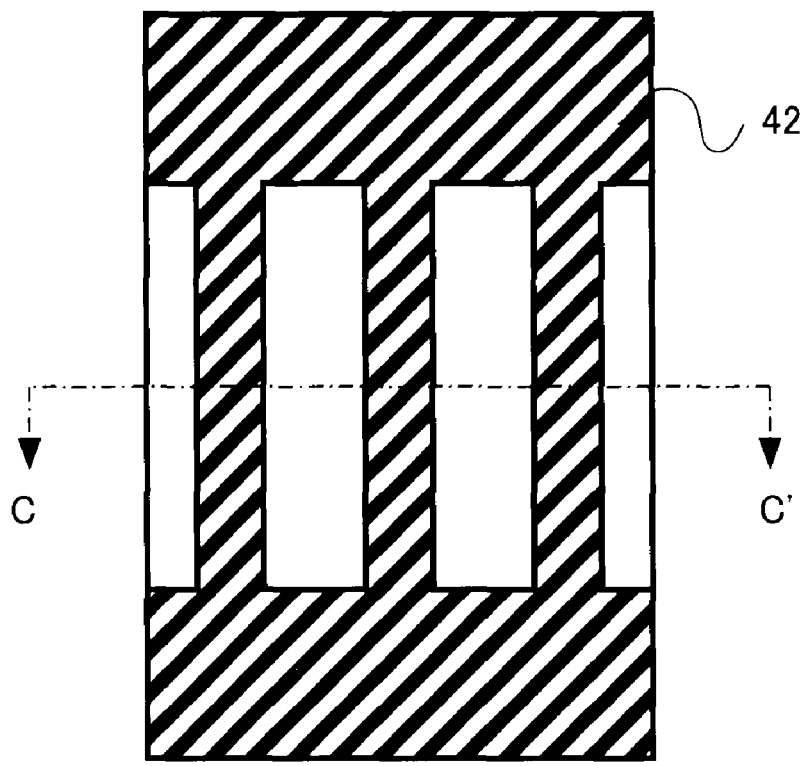
FIG. 9 is a top plan view diagram showing the manufacturing method of the semiconductor device of the first embodiment.

Next, an explanation will be given of a manufacturing method of the semiconductor device of this embodiment with reference to FIGS. 8 through 14 below. FIGS. 8 and 10-14 are diagrams schematically showing cross-sections in the manufacture of the semiconductor device of this embodiment. Additionally, FIG. 9 is a diagram showing a top plan view of a device structure in the manufacture of the semiconductor device of this embodiment.

Figure 10:
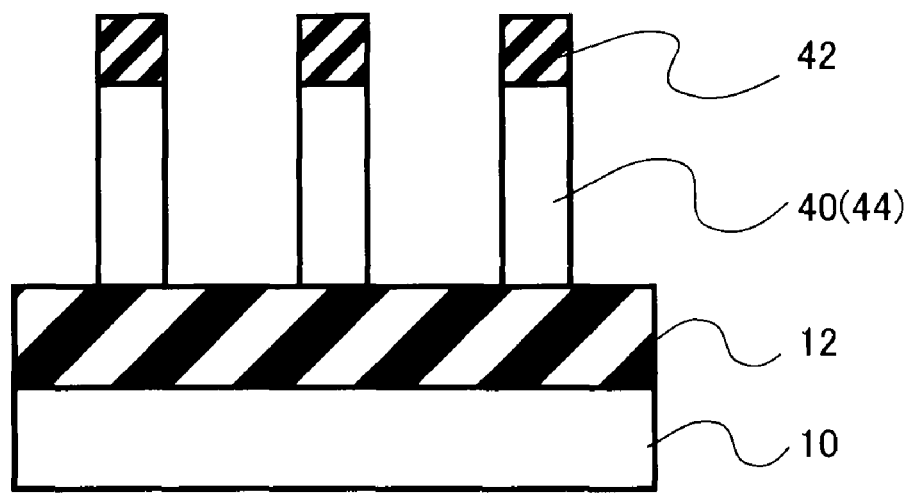
FIGS. 10 to 14 are schematic sectional diagrams showing the manufacturing method of the semiconductor device of the first embodiment.

Firstly, as shown in FIG. 8, a structure which consists essentially of a buried oxide film 12, SOI layer 44 and hard mask layer 42 is formed on a substrate silicon 10. Subsequently, as shown in FIG. 9 and FIG. 10 (sectional diagram taken along line C-C' of FIG. 9), after having patterned the hard mask layer 42, the SOI layer 44 is etched with this hard mask layer 42 being as a mask to process the SOI layer 44 to become narrower in the direction along the rectangular semiconductor layer width, thereby to form rectangular semiconductor layers 40.

Figure 11:
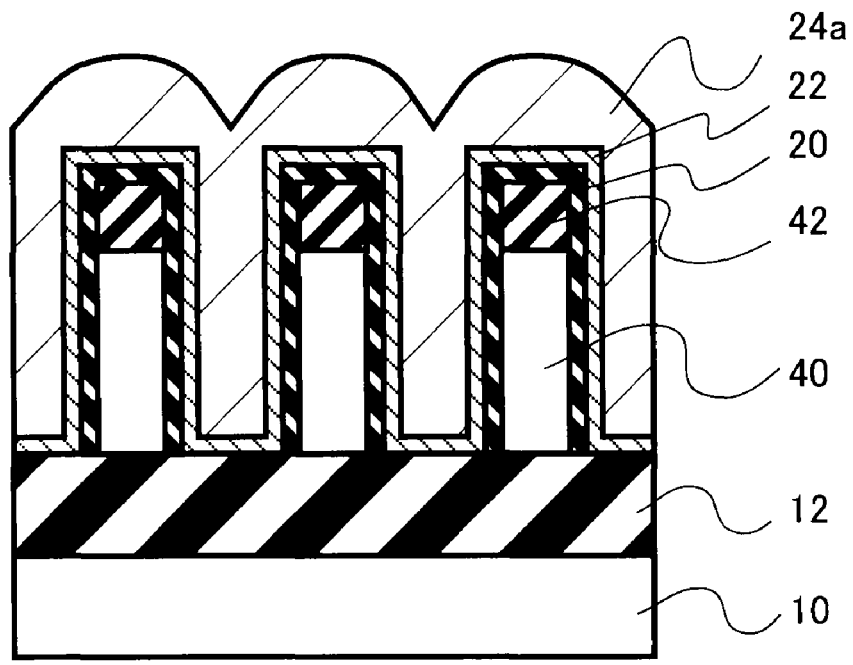
Figure 12:
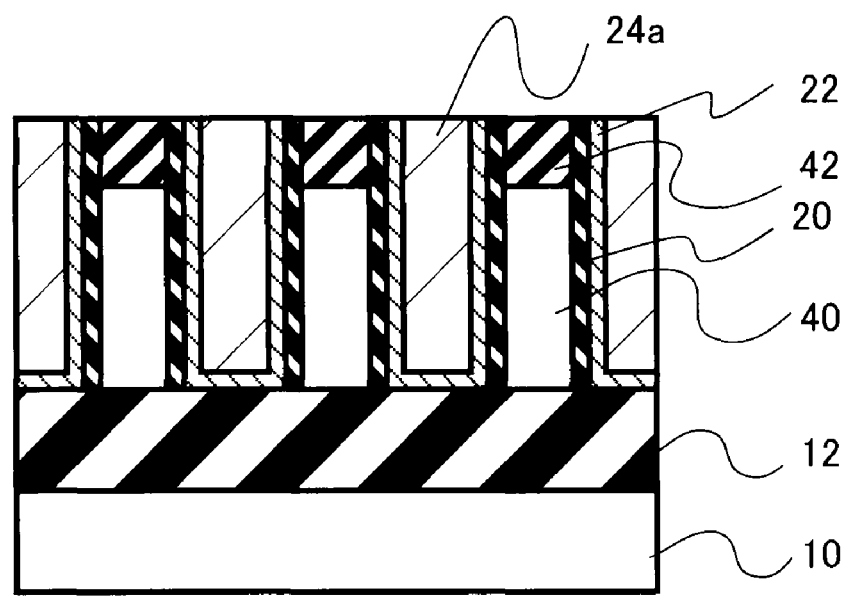

Subsequently, as shown in FIG. 11, a gate insulating film 20 is formed on sidefaces of the rectangular solid-shaped semiconductor layers 40 and top surface and sidefaces of the hard mask layer 42. On this gate insulator film 20, a metal film 22 is formed; furthermore, on this metal film 22, a polysilicon film 24a is deposited, in which a P impurity is in-situ doped. By this poly-Si film 24a, a space between adjacent ones of the rectangular semiconductor layers 40 is filled. Then, as shown in FIG. 12, the poly-Si film 24a is polished for planarization, thus exposing the hard mask layer 42.

Figure 13:
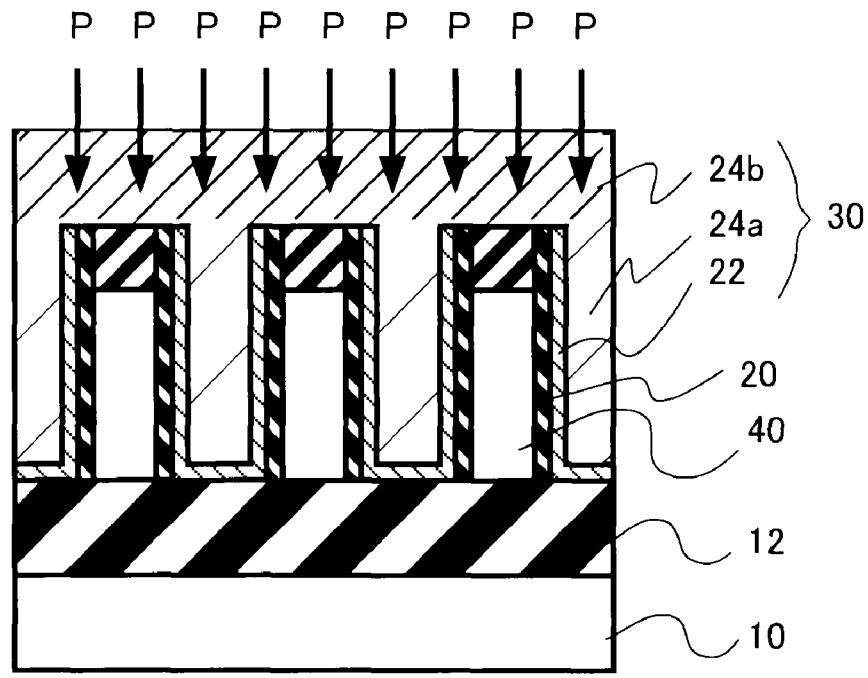

Subsequently, as shown in FIG. 13, a phosphorus (P) in-situ doped poly-silicon film 24b is additionally formed on the planarized poly-Si film 24a. Thereafter, a chosen impurity, e.g., P, is doped by ion implantation into this poly-Si film 24b to a high concentration to thereby amorphasize the poly-Si film 24b. Subsequently, a hard mask layer for the gate electrode patterning use is formed on the poly-Si film 24b; then, this hard mask layer is patterned. Thereafter, with this hard mask layer being as a mask, the poly-Si film 24 and metal film 22 plus gate insulator film 20 are patterned. Thereafter, a sidewall insulation film 34 (FIG. 6, 7) is formed on both sides of the gate length direction of the gate electrode 30.

Figure 14:
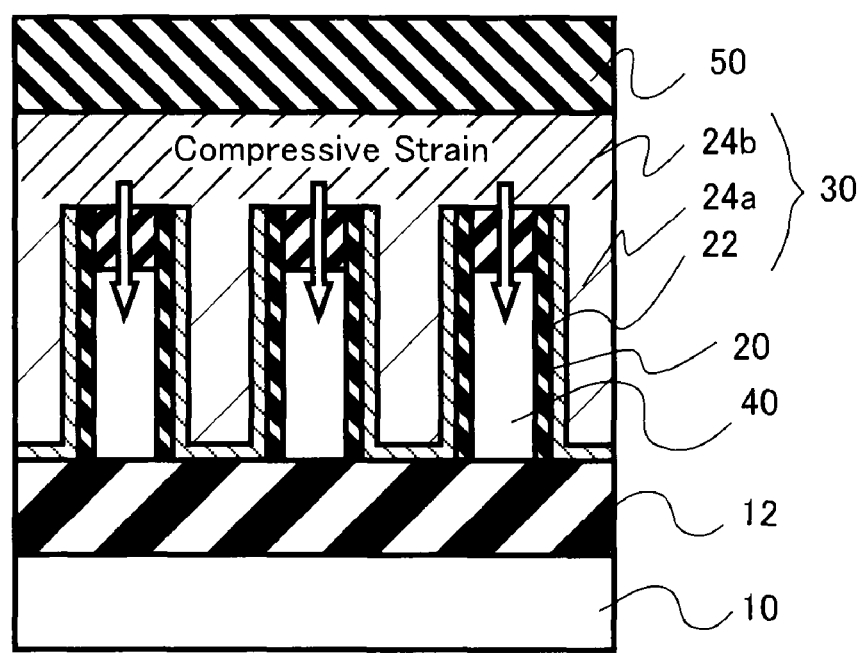

Thereafter, with the gate electrode-patterning hard mask layer and the sidewall insulation film 34 being as a mask, a p-type impurity is doped into the rectangular semiconductor layer 40, thereby forming source/drain regions 32 (FIG. 6, 7). Subsequently, after having removed the gate electrode-patterning hard mask layer, a stress liner dielectric film 50 is formed on the gate electrode 30 as shown in FIG. 14; then, annealing processing is performed by means of rapid thermal anneal (RTA) techniques for example to thereby crystallize the poly-Si film 24b, thus causing a compressive stress to be induced in the gate electrode 30. Thereafter, the stress liner dielectric film 50 is removed away.

With the manufacturing processes above, the semiconductor device of this embodiment shown in FIGS. 1 and 6-7 is formed.

Note that when performing ion implantation of the high concentration impurity into the poly-Si film 24b, it is desirable to set an acceleration energy in such a way that a projected range Rp stays within the poly-Si film 24b. This acceleration energy setting is in order to reduce ion implantation damages to be given to the gate insulator film 20 and others and also to retain an effective concentration distribution for strain application of the poly-Si film 24.

An example of the stress liner dielectric film 50 as used herein is a silicon nitride film or silicon oxide film or the like, which is formed by chemical vapor deposition (CVD) methods.

Although in this embodiment the p-channel FinFET of the (100)-plane sideface type has been explained, it is apparent from viewing FIG. 3 also that similar drive current increasing effects are obtainable even when a similar structure and process are applied to an n-channel FinFET of the (110) sideface.

Second Embodiment

A semiconductor device of this embodiment is a p-channel nano-wire transistor, which is similar to the semiconductor device of the first embodiment shown in FIG. 1 with the hard mask layer 42 being removed and also with the gate electrode being also provided on the top surface of rectangular semiconductor layer 40, i.e., the upper face of channel region 18 by letting a gate insulator film be interposed therebetween. This embodiment is similar to the first embodiment except that the structure of FinFET is used as the nanowire transistor structure; so, a description will be eliminated as to duplicative contents thereof.

Figure 15:
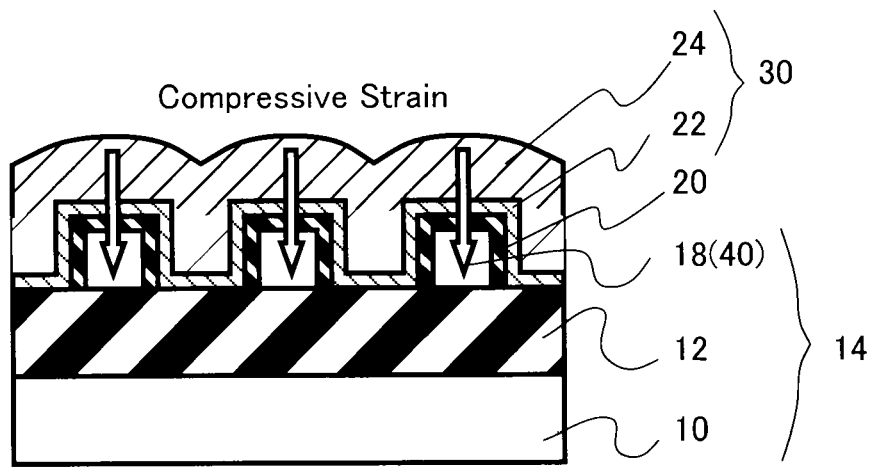
FIG. 15 is a schematic sectional diagram of a semiconductor device of a second embodiment.

FIG. 15 is a schematic sectional diagram of the semiconductor device of this embodiment in a direction at right angles to the gate length direction of it. As shown in FIG. 15, the gate insulator film 20 is formed also on the upper surface of the channel region 18 to be formed at the rectangular solid-like semiconductor layer 40 having the (100)-plane sideface, and the gate electrode 30 having a multilayer structure of metal film 22 and poly-Si film 24 is formed through the gate insulator film 20 in such a manner as to cover the channel region 18. In this way, this nanowire transistor has the so-called tri-gate structure having three gate electrodes on the top surface and both sidefaces of the channel region 18 of rectangular semiconductor layer 40.

In this nanowire transistor, the impurity concentration in the poly-Si film 24 of gate electrode 30 is not uniform. The impurity concentration becomes higher in a direction toward upside from the lowermost layer of the poly-Si film 24 of gate electrode 30, i.e., the SOI substrate 14 side. Owing to this feature, the poly-Si film 24 is such that the impurity concentration in a region above the height of the upper surface of channel region 18 becomes higher than the impurity concentration at the height of the upper face of channel region 18.

By lowering the impurity concentration of the regions on both sidefaces of the channel region 18 in the poly-Si film 24 and at the same time increasing the impurity concentration of the region at upside of the channel region 18 in this way, the amorphasization of the poly-Si film 24 and the volume expansion in the SMT process take place dominantly only in the region on the upside of the rectangular semiconductor layer 40, in which the channel region 18 is formed. Accordingly, a compressive strain is induced only in the direction perpendicular to the SOI substrate 14 (strain amount of 0.05% or greater) whereas any compressive strain is not induced in the direction perpendicular to the sidefaces of rectangular semiconductor layer 40 (strain amount of 0.05° or less).

Consequently, as apparent from FIG. 4, the p-channel nanowire transistor of this embodiment is such that the carrier mobility is improved in a similar way to the pFinFET of the first embodiment. Thus, it is possible to realize the p-channel nanowire transistor with increased drive current amount, i.e., enhanced current drivability.

An explanation will next be given of a manufacturing method of the semiconductor device of this embodiment with reference to FIGS. 16 to 21. FIGS. 16-21 are diagrams schematically showing cross-sectional structures in the manufacture of the semiconductor device of this embodiment.

Figure 16:
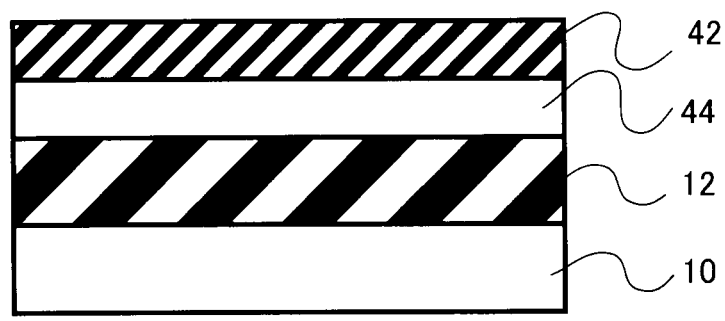
FIGS. 16 through 21 are schematic sectional diagrams showing a manufacturing method of the semiconductor device of the second embodiment.
Figure 17:
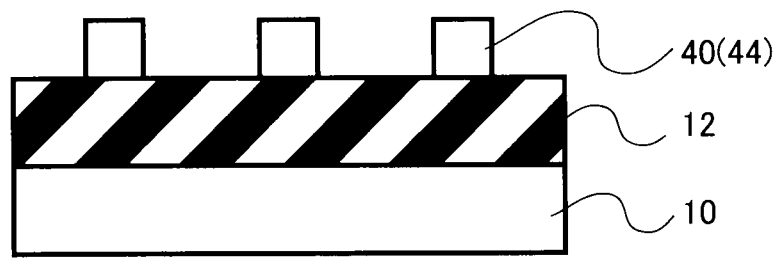

First, as shown in FIG. 16, a structure that consists essentially of a buried oxide film 12, SOI film 44 and hard mask layer 42 is formed on a substrate silicon 10. Then, as shown in FIG. 17, after having patterned the hard mask layer 42, the SOI layer 44 is etched with this hard mask layer 42 being as a mask to narrow the SOI layer 44 in the rectangular semiconductor layer width direction, thereby forming rectangular box-like semiconductor layers 40.

Figure 18:
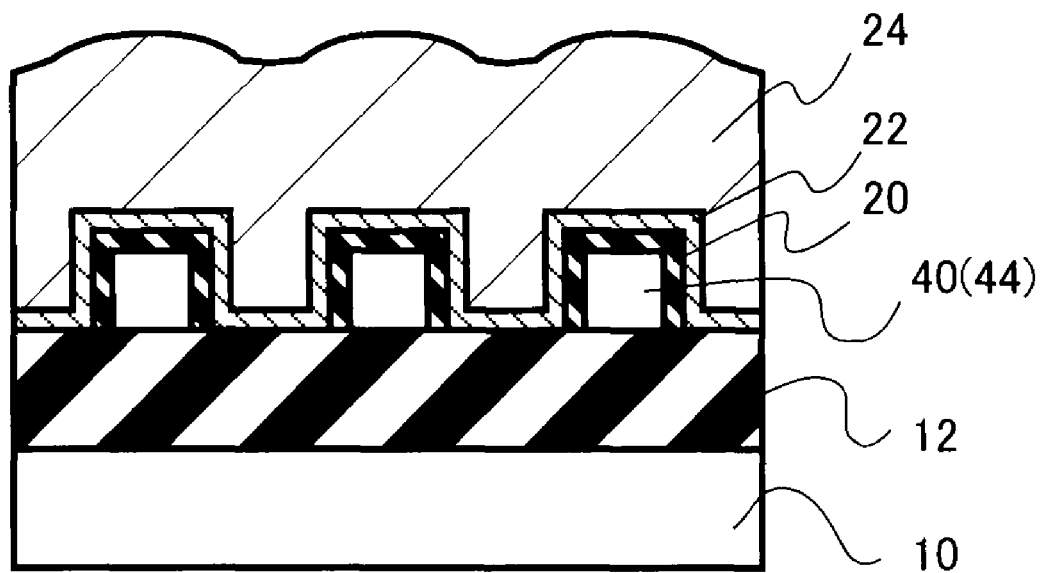
Figure 19:
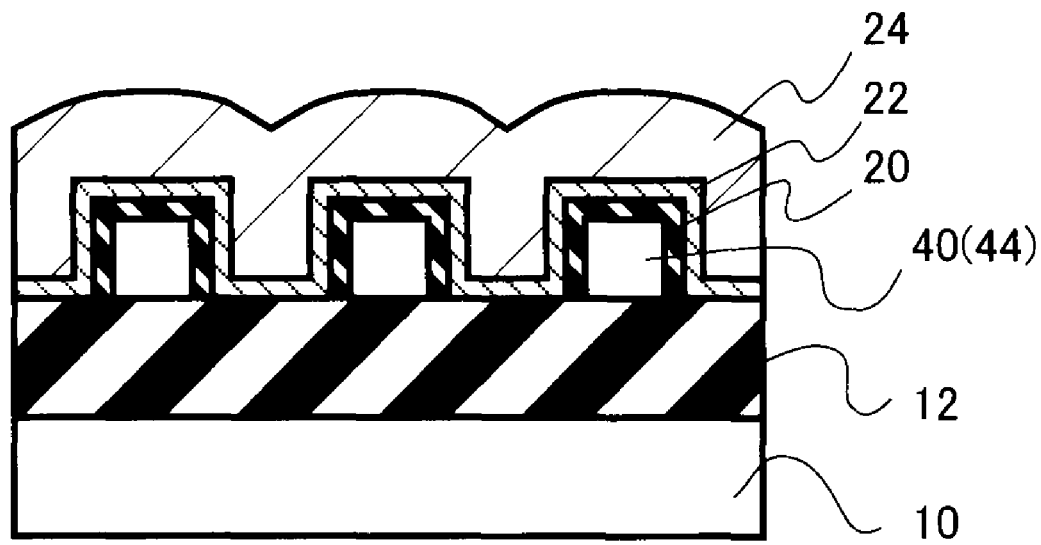

Subsequently, as shown in FIG. 18, a gate insulator film 20 is formed on top and side surfaces of the rectangular semiconductor layers 40. Then, a metal film 22 is formed on this gate insulator film 20; further, on this metal film 22, a polysilicon film 22 with P impurity in-situ doped therein is deposited. By this poly-Si film 24, spaces between neighboring rectangular semiconductor layers 40 are filled. Subsequently as shown in FIG. 19, the poly-Si film 24 is subjected to etch-back, causing it to become a thin film.

Figure 20:
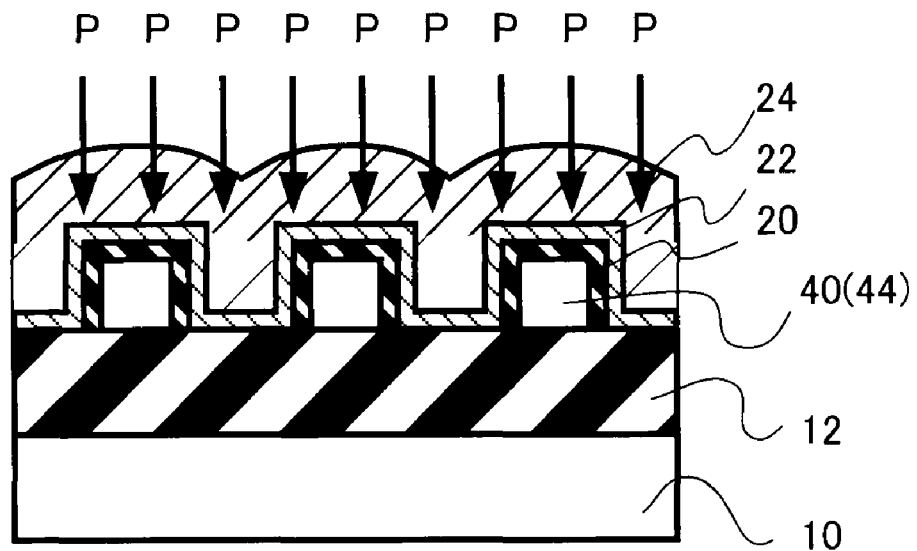

Then, as shown in FIG. 20, a high concentration impurity, e.g., P, is doped by ion implantation into the thin-filmed poly-Si film 24 to thereby amorphasize upper part of this poly-Si film 24. Subsequently, a hard mask layer for the gate electrode patterning use is formed on the poly-Si film 24; then, this hard mask layer is patterned. Thereafter, with this hard mask layer being as a mask, the poly-Si film 24 and metal film 22 and gate insulator film 20 are patterned. Thereafter, a sidewall dielectric film (not shown) is formed on both sides of the gate electrode 30 in the gate length direction.

Figure 21:
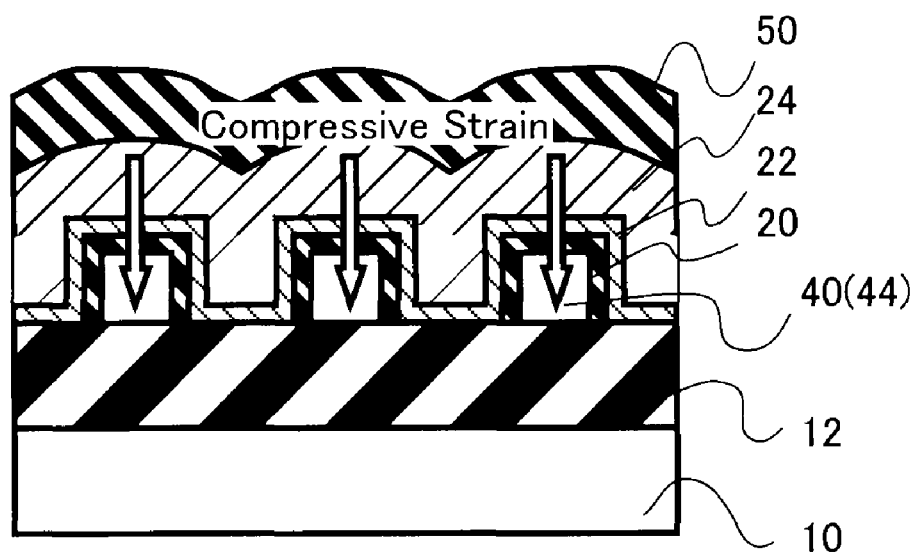

Thereafter, with the gate electrode-patterning use hard mask layer and the sidewall dielectric film 34 being as a mask, a p-type impurity is doped into the rectangular semiconductor layer 40 to thereby form source/drain regions (not shown). Subsequently, after having removed the gate electrode-patterning use hard mask layer, a stress liner dielectric film 50 is formed on the poly-Si film 24 as shown in FIG. 21; then, annealing is performed by PTA techniques, for example, to thereby crystallize the poly-Si film 24b, thus causing a compressive stress to be induced in the poly-Si film 24 of gate electrode 30. Thereafter, the stress liner dielectric film 50 is removed away.

By the manufacturing processes above, the semiconductor device of this embodiment shown in FIG. 15 is formed.

It should be noted that upon ion implantation of the impurity of high concentration into the poly-Si film 24, it is desirable to set the acceleration energy in such a way that the projected range Rp is above the top surface of rectangular semiconductor layer 40. This is in order to reduce ion implantation damage to be given to the gate insulator film 20 or else and also tb retain an effective concentration distribution for strain application of the poly-Si film 24.

Also note that although in this embodiment the p-channel (100)-plane sideface nanowire transistor was explained, similar drive current increase effects are also obtainable by applying a similar structure and process to an n-channel nanowire transistor of the (110) sideface type as apparent from FIG. 3 also.

Third Embodiment

A semiconductor device of this embodiment is a p-channel FinFET which is similar to the semiconductor device of the first embodiment shown in FIG. 1, with the semiconductor film of gate electrode being modified so that its lowermost surface is above the top surface of a rectangular solid-like semiconductor layer. The device is the same as the first embodiment except this structural difference; so, a duplicative description will be omitted herein.

Figure 22:
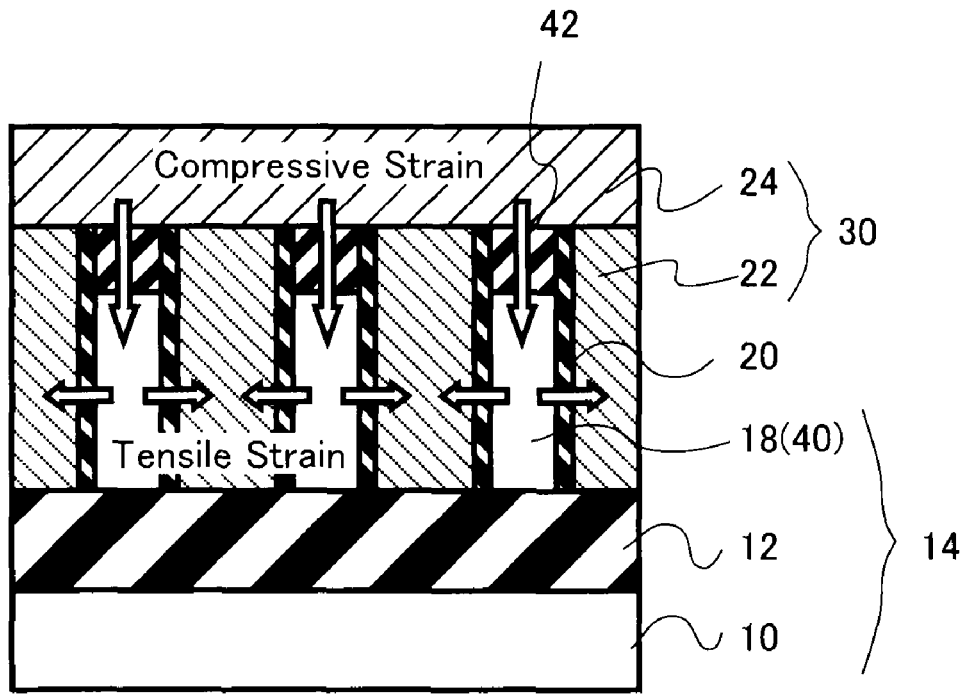
FIG. 22 is a sectional diagram of a semiconductor device of a third embodiment.

FIG. 22 is a schematic sectional diagram of the semiconductor device of this embodiment in a direction at right angles to the gate length direction thereof. As shown in FIG. 22, the lowermost surface of the poly-Si film 24 of gate electrode 30 is arranged to overlie the upper surface of channel region 18, i.e., the top surface of rectangular semiconductor layer 40. In other words, it becomes a structure with a space between adjacent channel regions 18 (rectangular semiconductor layers 40) being buried with the metal film 22.

The structure that overlies the hard mask layer 42 is similar to that of the semiconductor device of the first embodiment so that a compressive strain is induced by the poly-Si film 24 within the rectangular semiconductor layer 40 in the direction perpendicular to the SOI substrate 14 (strain amount of 0.05% or more). Additionally, although the space between neighboring rectangular semiconductor layers 40 is fully filled with the metal film 22, the metal film 22 behaves to shrink when an attempt is made to cool down it to room temperatures after having formed the metal film 22 at high temperatures because metals are larger than silicon in thermal expansion coefficient. As a result of this metal shrink, the compressive strain within rectangular semiconductor layer 40 in the perpendicular direction to SOI substrate 14 further increases, resulting in an extension or tensile strain being induced in a direction perpendicular to the sidefaces of rectangular semiconductor layer 40.

Accordingly, as apparent from FIG. 4, the pFinFET of this embodiment is such that the carrier mobility is further improved when compared to the pFinFET of the first embodiment. Thus it is possible to achieve the p-channel FinFET with further increased drive current amount.

Figure 23:
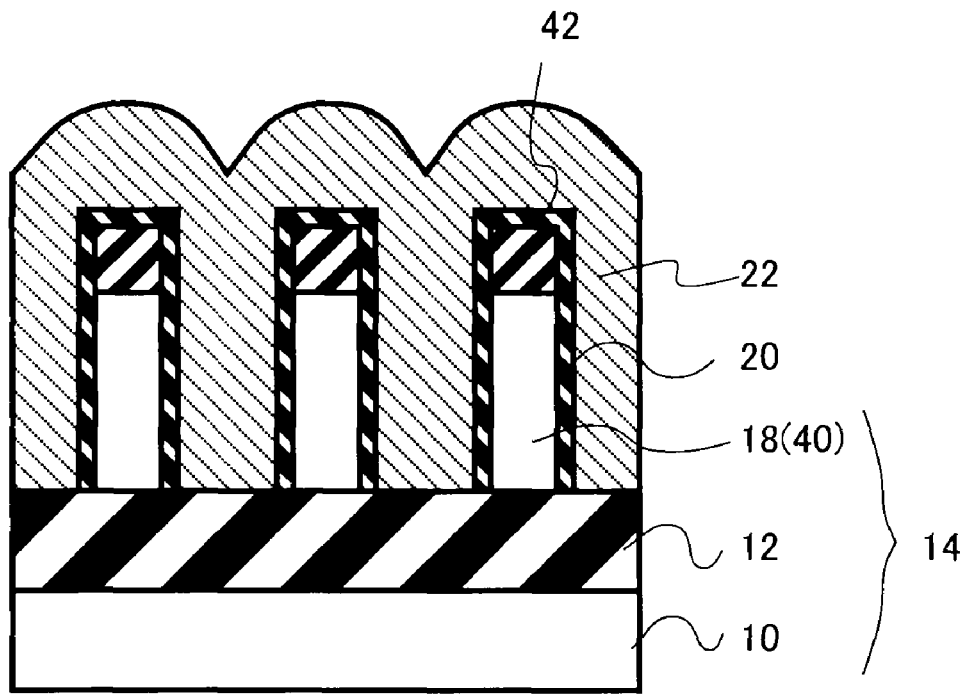
FIGS. 23 and 24 are schematic sectional diagrams showing a manufacturing method of the semiconductor device of the third embodiment.
Figure 24:
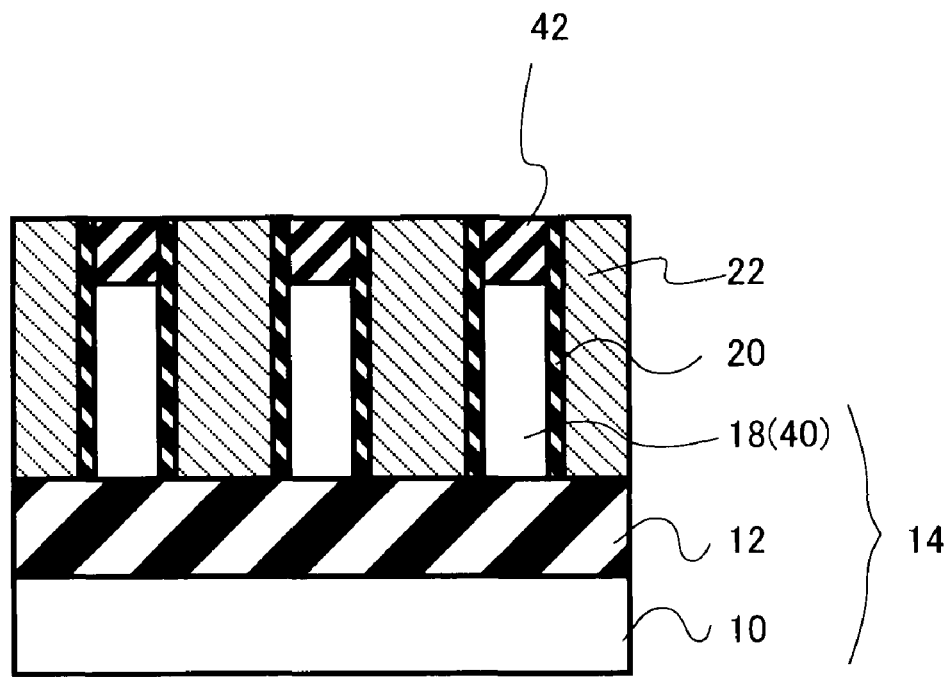

An explanation will next be given of a manufacturing method of the semiconductor device of this embodiment with reference to FIGS. 23-24, the explanation being related in particular to its different points from the manufacturing method of the first embodiment. FIGS. 23 and 24 are schematic sectional diagrams showing manufacturing process steps of the semiconductor device of this embodiment.

As shown in FIG. 23, after having formed a gate insulator film 20 on both sidefaces of rectangular box-like semiconductor layers 40, a metal film 22 is formed on the gate insulator film 20 in such a manner as to fill a space between adjacent ones of the rectangular semiconductor layers 40. Then, as shown in FIG. 24, the metal film 22 is planarized by polishing to thereby expose the hard mask layer 44. Thereafter, through similar process steps to those of the first embodiment, the semiconductor device of this embodiment shown in FIG. 22 is fabricated.

Although in this embodiment the p-channel (100) sideface FinFET was explained, similar drive current increasing effects are obtainable by applying a similar structure and process to an n-channel (110) sideface FinFET as apparent from FIG. 3 also.

Additionally, similar effects are obtainable by applying the device structure of this embodiment to the nanowire transistor of the second embodiment also.

Fourth Embodiment

A semiconductor device of this embodiment is similar to the semiconductor device of the first embodiment shown in FIG. 1 with the SOI substrate being replaced by a bulk silicon substrate. Thus, a description of its duplicate contents will be omitted.

Figure 25:
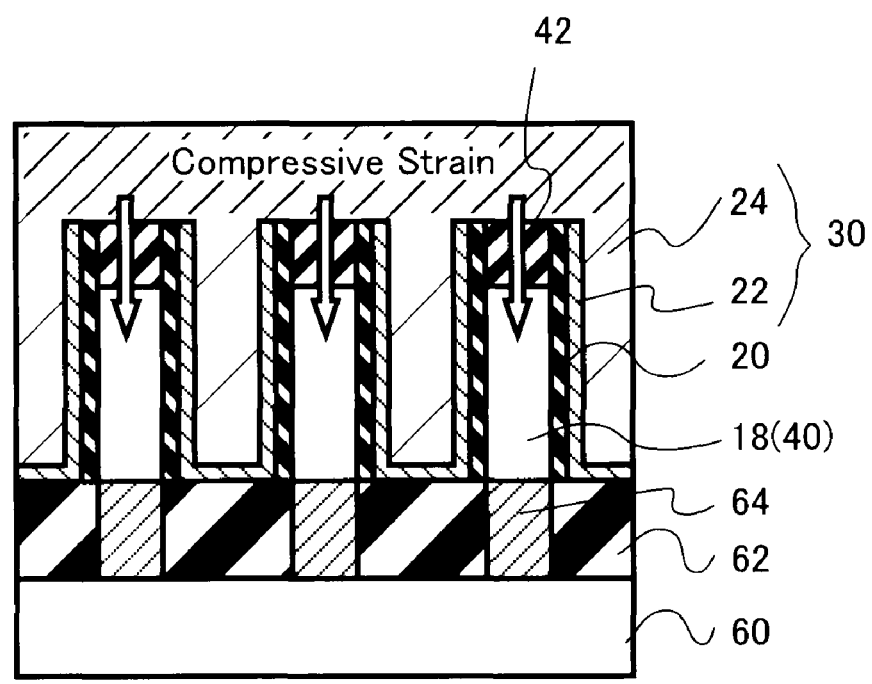
FIG. 25 is a schematic sectional diagram showing a semiconductor device of a fourth embodiment.

FIG. 25 is a schematic sectional diagram of the semiconductor device of this embodiment in a direction perpendicular to the gate length direction thereof. As shown herein, a pFinFET is formed on a bulk silicon substrate 60, rather than on the SOI substrate. For example, a device isolation dielectric film 62 of silicon oxide film and a punch-through suppression semiconductor layer 64 which underlies each rectangular semiconductor layer 40 and which is interposed by the element isolation dielectric film 62 are disposed.

Here, in order to cut off a current flow path (punch-through) of from the source to drain via the bulk silicon substrate 60, the punch-through suppression semiconductor layer 64 is preferably arranged so that its impurity concentration is greater than or equal to $1 \times 10^{18}$ cm$^{-3}$ and less than or equal to $1 \times 10^{20}$ cm$^{-3}$.

A device structure excluding the semiconductor substrate is identically the same as that of the semiconductor device of the first embodiment so that performance improvement of the transistor is similarly expectable owing to the strain that is induced by the poly-Si film of gate electrode. In addition, the bulk silicon substrate is less in cost than the SOI substrate; thus, according to this embodiment, it is possible to reduce manufacturing costs.

Figure 26:
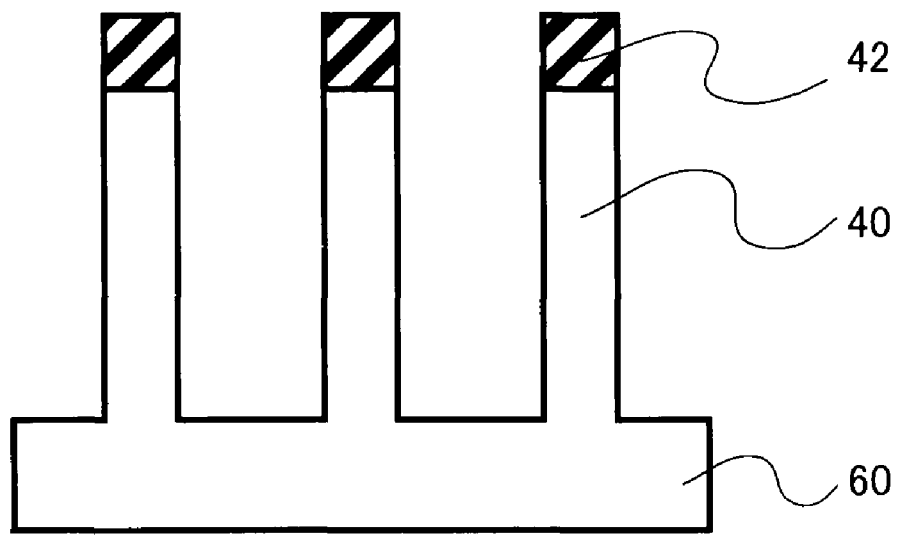
FIGS. 26-28 are schematic sectional diagrams showing a manufacturing method of the semiconductor device of the fourth embodiment.
Figure 27:
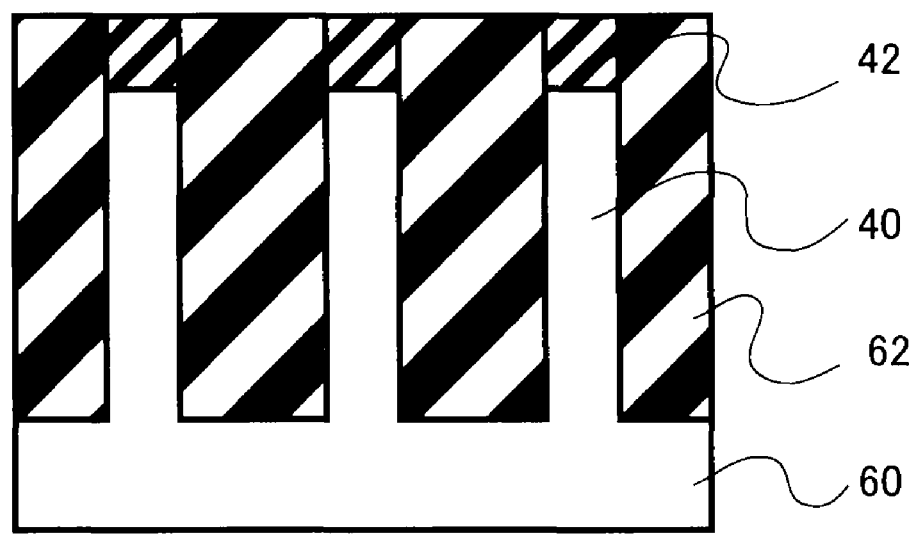
Figure 28:
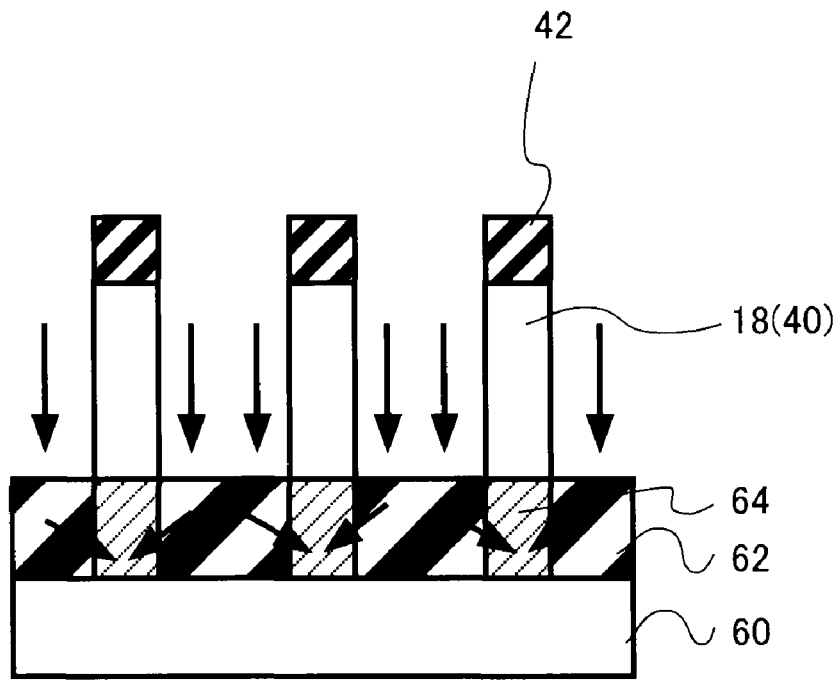

Next, an explanation will be given of a manufacturing method of the semiconductor device of this embodiment with reference to FIGS. 26 to 28, the explanation being related particularly to its differences from the manufacturing method of the first embodiment. FIGS. 26-28 are schematic sectional diagrams showing manufacturing process steps of the semiconductor device of this embodiment.

As shown in FIG. 26, after having patterned a hard mask layer 42 on the bulk silicon substrate 60, the bulk silicon substrate 60 is etched with this hard mask layer 42 being as a mask to process the bulk silicon substrate 60 to become narrower in the rectangular semiconductor layer width direction, thereby forming rectangular semiconductor layers 40. Next, as shown in FIG. 27, a device isolation dielectric film 62 is deposited and planarized by polish techniques to thereby expose the hard mask layer 42.

Next, as shown in FIG. 28, the device isolation dielectric film 62 is subjected to etchback by reactive ion etching (RIE); thereafter, a chosen impurity, e.g., P, is doped thereinto by ion implantation, thereby to form a punch-though suppressing semiconductor layer 64 under each rectangular semiconductor layer 40. Thereafter, through similar process steps to those of the first embodiment, the semiconductor device of this embodiment shown in FIG. 25 is fabricated.

Note that although in this embodiment the p-channel FinFET of the (100) sideface has been explained, similar drive current increase effects are obtainable by applying a similar structure and process to an n-channel (110) sideface FinFET as apparent from FIG. 3 also.

Additionally, similar effects are obtainable by applying the structure of this embodiment to the nanowire transistor of the second embodiment also.

Fifth Embodiment

A semiconductor device of this embodiment is similar to the semiconductor device of the first embodiment shown in FIG. 1 with the metal film being omitted and with the gate electrode being made of a single poly-silicon film alone. Thus, a description of its duplicate contents will be eliminated herein.

Figure 29:
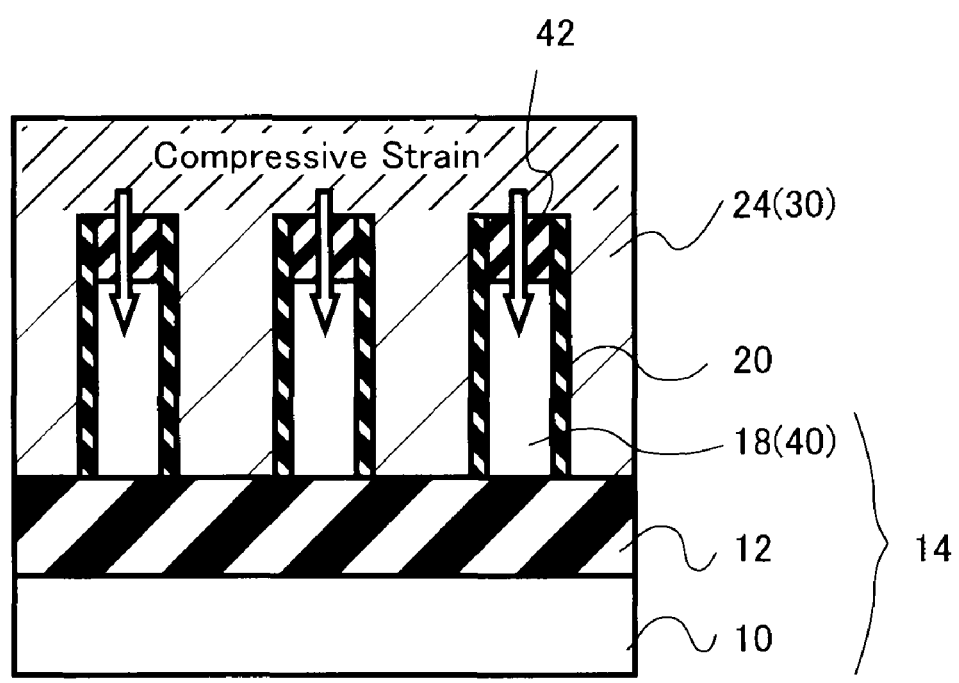
FIG. 29 is a pictorial sectional diagram showing a semiconductor device of a fifth embodiment.

FIG. 29 is a schematic sectional diagram of the semiconductor device of this embodiment, which is at right angles to the gate length direction of it. As shown herein, the gate electrode 30 is formed by a single layer of poly-Si film 24.

Except for the arrangement that the gate electrode 30 is a single layer consisting of the poly-Si film 24 only, the remaining structure is identically the same as the semiconductor device of the first embodiment; so, transistor performance improvement is similarly expectable owing to the strain that is induced by the poly-Si film of gate electrode. In addition, according to this embodiment, there is an advantage that the manufacturing of the semiconductor device becomes easier and decreases in production cost because the gate electrode is arranged to have the single-layer structure.

Note that although in this embodiment the p-channel (100) sideface FinFET was explained, similar drive current increase effects are obtainable by applying a similar structure and process to an n-channel (110) sideface FinFET as apparent from FIG. 3 also.

Additionally, similar effects are obtainable by applying the structure of this embodiment to the nanowire transistor of the second embodiment also.

Sixth Embodiment

A semiconductor device of this embodiment is a complementary semiconductor device which is constituted from a p-channel (100) sideface FinFET and an n-channel (100) sideface FinFET. This semiconductor device has a semiconductor substrate, more than one rectangular solid-shaped semiconductor layer which is formed at upper part of the semiconductor substrate and which has a top surface parallel to the semiconductor substrate's principal plane and side faces with a (100) crystal plane that is perpendicular to the principal plane of the semiconductor substrate, and a p-channel metal insulator semiconductor field effect transistor (pMISFET). This pMISFET has a channel region which is formed within the rectangular solid-like semiconductor layer, a gate insulating film which is formed on sidefaces of the channel region, a gate electrode which covers the channel region with the gate insulator film being sandwiched therebetween, and a pair of source/drain regions which are formed within the rectangular semiconductor layer in such a manner as to interpose the channel region therebetween, wherein a compressive strain is applied to the channel region in a direction perpendicular to the semiconductor substrate principal plane. This embodiment device further includes a second rectangular solid-shaped semiconductor layer which is formed at upper part of the semiconductor substrate and which has a second top surface that is parallel to the semiconductor substrate principal plane and second sidefaces with a (100) plane that is perpendicular to the semiconductor substrate principal plane, and an n-channel MISFET (nMISFET). This nMISFET has a second channel region which is formed within the second rectangular semiconductor layer, a second gate insulating film which is formed on the second sidefaces of the second channel region, a second gate electrode which covers the second channel region with the second gate insulator film being sandwiched therebetween, and a pair of second source/drain regions which are formed within the second rectangular semiconductor layer in such a manner as to interpose the second channel region therebetween, wherein both a compressive strain which is in the direction perpendicular to the semiconductor substrate principal plane and a compressive strain that is in the direction perpendicular to the second sidefaces are applied together to the second channel region.

Figure 30:
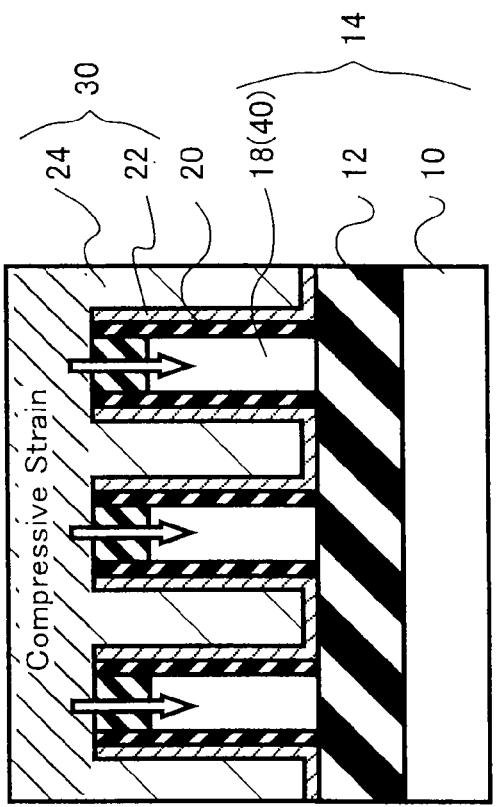
FIG. 30 is a sectional diagram of a semiconductor device of a sixth embodiment.
Figure 30:
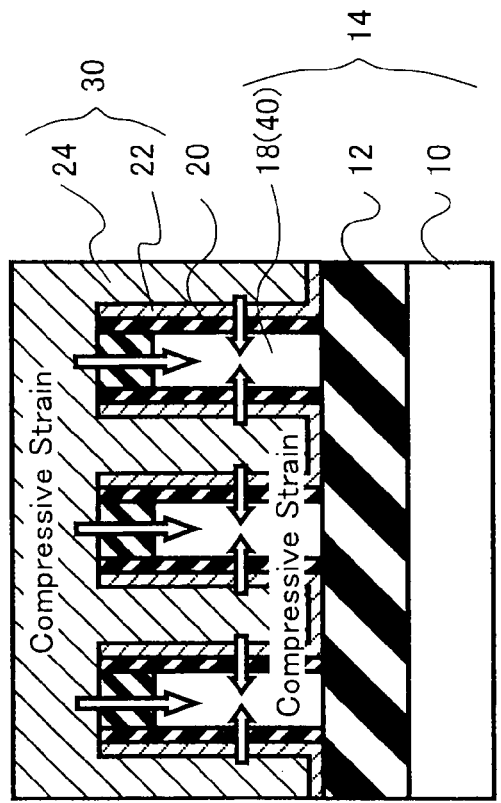

FIG. 30 is a schematic sectional diagram of the complementary semiconductor device of this embodiment. Left-hand part of this diagram shows an n-channel FinFET whereas its right-hand part is a p-channel FinFET. The p-channel FinFET has the structure of the first embodiment of FIG. 1; the n-channel FinFET becomes the structure that has been explained in conjunction with FIG. 2.

Regarding the p-channel FinFET, this is formed so that the impurity concentration in a poly-Si film 24 rises up in a direction along the thickness of from the lowermost layer of the poly-Si film 24 up to the height of an upper surface of a hard mask layer 42 and also the impurity concentration in a region above the height of the upper face of the hard mask layer 42 becomes higher when compared to the impurity concentration at the height of the upper face of the hard mask layer 42. An example is that the impurity concentration of the lowermost layer of the poly-Si film 24 is greater than or equal to $2\times10^{19}$ cm$^{-3}$ and yet less than or equal to $2\times10^{20}$ cm$^{-3}$ whereas the impurity concentration in the region overlying the height of the upper face of hard mask layer 42 is more than or equal to $2\times10^{20}$ cm$^{-3}$ and less than or equal to $2\times10^{21}$ cm$^{-3}$. As for the n-channel FinFET, the impurity concentration in the poly-Si film 24 is almost uniform and is set, for example, to $2\times10^{20}$ cm$^{-3}$ or more and less than or equal to $2\times10^{21}$ cm$^{-3}$.

With these impurity concentration distribution settings, the p-channel FinFET is such that the compressive strain is induced only in the perpendicular direction to the principal plane of the semiconductor substrate (strain amount of 0.05% or greater), with no compressive strain being induced in the perpendicular direction to the sidefaces of rectangular semiconductor layer (strain amount of 0.05% or less); as for the n-channel FinFET, the compressive strain is induced both in the perpendicular direction to the semiconductor substrate principal plane and in the perpendicular direction to the rectangular semiconductor layer sidefaces (strain amount of 0.05% or more). As a result, as apparent from FIGS. 3 and 4, it is possible to improve both the performance of the n-channel FinFET and that of the p-channel FinFET at a time.

Note here that maximal performance improvement is expected when the structure of the first embodiment is introduced into an n-channel (110) sideface FinFET and p-channel (100) sideface FinFET. However, in the case of arranging the complementary FinFET having n-channel FinFET and p-channel FinFET, it is preferable that sideface crystal orientations of the n-channel and p-channel FinFETs be the same as each other as in this embodiment in order to suppress an increase in circuit layout area.

Also note that although the FinFETs have been explained here, similar effects are also obtainable by applying the structure of this embodiment to nanowire transistors.

Seventh Embodiment

A semiconductor device of this embodiment is a complementary semiconductor device which is made up of a p-channel (110) sideface FinFET and an n-channel (110) sideface FinFET. This semiconductor device has a semiconductor substrate, a rectangular solid-shaped semiconductor layer which is formed at an upper part of the semiconductor substrate and which has a top surface that is parallel to a principal plane of the semiconductor substrate and side surfaces with a (110) crystal plane that is perpendicular to the semiconductor substrate principal plane, a second rectangular solid-shaped semiconductor layer which is formed at the upper part of the semiconductor substrate and which has a second top surface that is parallel to the principal plane of the semiconductor substrate and second side surfaces with a (110) plane perpendicular to the semiconductor substrate principal plane, a pMISFET and an nMISFET. The pMISFET has a channel region which is formed within the rectangular semiconductor layer, a gate insulator film which is formed on sidefaces of the channel region, a gate electrode which covers the channel region with the gate insulator film being sandwiched therebetween, and a pair of source/drain regions which are formed within the rectangular semiconductor layer in such a manner as to interpose the channel region therebetween. The nMISFET has a second channel region which is formed within the second rectangular semiconductor layer, a second gate insulator film which is formed on the second sidefaces of the second channel region, a second gate electrode which covers the second channel region with the second gate insulator film being sandwiched therebetween, and a pair of second source/drain regions which are formed within the second rectangular semiconductor layer in such a manner as to interpose the second channel region therebetween, wherein a compressive strain which is in a direction perpendicular to the semiconductor substrate principal plane is applied to the second channel region.

Figure 31:
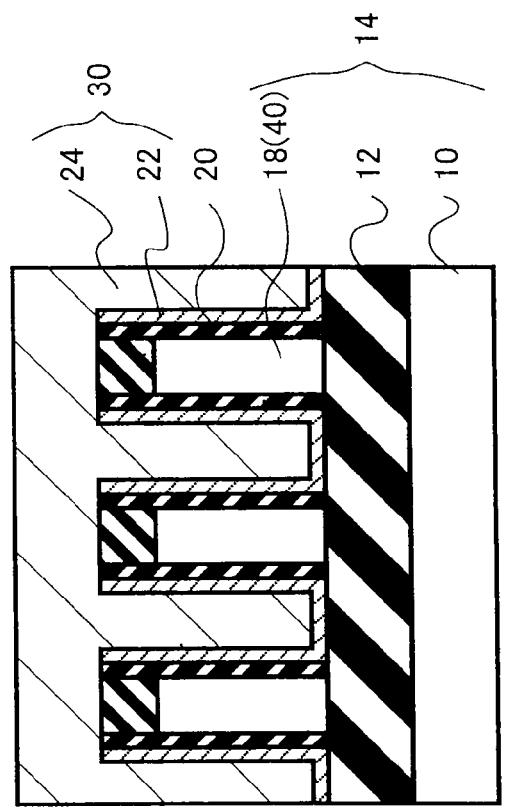
FIG. 31 is a sectional diagram of a semiconductor device of a seventh embodiment.
Figure 31:
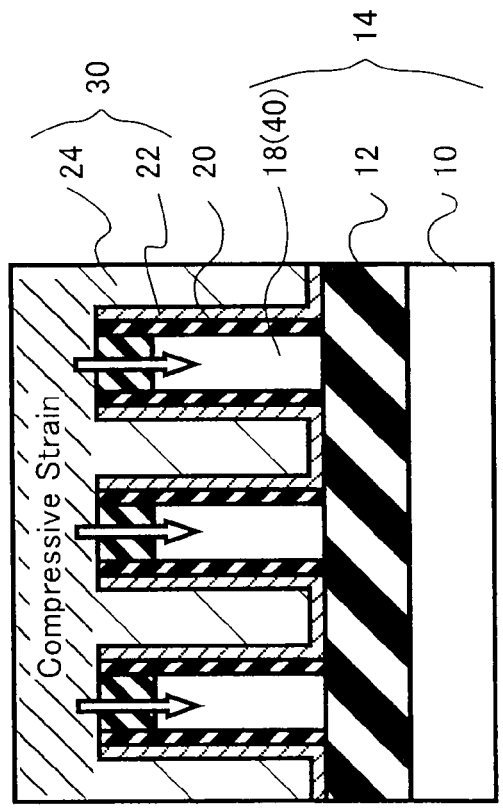

FIG. 31 is a schematic sectional diagram of the complementary semiconductor device of this embodiment. Left part of this diagram shows an n-channel FinFET whereas right part is a p-channel FinFET. The n-channel FinFET is the one that applies the structure of the first embodiment of FIG. 1 to n-channel FinFET.

Regarding the n-channel FinFET, this is formed so that the impurity concentration in a poly-Si film 24 increases in a direction along the thickness of from the lowermost layer of the poly-Si film 24 up to the height of an upper surface of a hard mask layer 42 and also the impurity concentration in a region above the height of the upper face of the hard mask layer 42 becomes higher when compared to the impurity concentration at the height of the upper face of the hard mask layer 42. For example, the impurity concentration of the lowermost layer of the poly-Si film 24 is greater than or equal to $2\times10^{19}$ cm$^{-3}$ and less than $2\times10^{20}$ cm$^{-3}$ whereas the impurity concentration in the region overlying the height of the upper face of hard mask layer 42 is more than or equal to $2\times10^{20}$ cm$^{-3}$ and less than or equal to $2\times10^{21}$ cm$^{-3}$. As for the p-channel FinFET, the impurity concentration in the poly-Si film 24 is almost uniform and is set at a relatively low level. For example, the impurity concentration is set to $2\times10^{19}$ cm$^{-3}$ or more and less than $2\times10^{20}$ cm$^{-3}$.

With the impurity concentration distribution settings, the n-channel FinFET is such that the compressive strain is induced only in the perpendicular direction to the principal plane of the semiconductor substrate (strain amount of 0.05% or greater), with no compressive strain being induced in the perpendicular direction to the sidefaces of rectangular semiconductor layer (strain amount of 0.05% or less); as for the p-channel FinFET, any compressive strain is not induced both in the perpendicular direction to the semiconductor substrate principal plane and in the perpendicular direction to the rectangular semiconductor layer sidefaces (strain amount of less than or equal to 0.05%). A result of this is that as apparent from FIGS. 3 and 4, it is possible to improve the performance of the n-channel FinFET while at the same time preventing performance degradation of the p-channel FinFET.

It is noted that although the FinFETs have been explained here, similar effects are also obtainable by applying the structure of this embodiment to nanowire transistors.

Eighth Embodiment

A semiconductor device of this embodiment is a complementary semiconductor device which is configured from a p-channel (100) sideface FinFET and an n-channel (100) sideface FinFET. This semiconductor device has a semiconductor substrate, a rectangular shaped semiconductor layer which is formed at an upper part of the semiconductor substrate and which has a top surface that is parallel to a principal plane of the semiconductor substrate and side faces with a (100) plane perpendicular to the semiconductor substrate principal plane, and a pMISFET. This pMISFET has a channel region which is formed at least on a sideface(s) of the rectangular semiconductor layer, a gate insulator film which is formed on the sidefaces of the rectangular semiconductor layer, a gate electrode which covers the channel region with the gate insulator film being sandwiched therebetween, and a pair of source/drain regions which are formed within the rectangular semiconductor layer in such a way as to interpose the channel region therebetween, wherein a compressive strain that is in the perpendicular direction to the semiconductor substrate principal plane and a tensile strain that is in a direction perpendicular to the sideface are applied to the channel region. The embodiment device further includes a second rectangular shaped semiconductor layer which is formed at the upper part of the semiconductor substrate and which has a second top surface parallel to the principal plane of the semiconductor substrate and second sidefaces with a (100) plane perpendicular to the semiconductor substrate principal plane, and an nMISFET. This nMISFET has a second channel region which is formed at least on the sideface(s) of the second rectangular semiconductor layer, a second gate insulator film which is formed on the second sidefaces of the second rectangular semiconductor layer, a second gate electrode which covers the second channel region with the second gate insulator film being sandwiched therebetween, and a pair of second source/drain regions which are formed within the second rectangular semiconductor layer in such a manner as to interpose the second channel region therebetween, wherein both a compressive strain that is in the perpendicular direction to the semiconductor substrate principal plane and a tensile strain in the perpendicular direction to the second sidefaces are applied to the second channel region.

Figure 32:
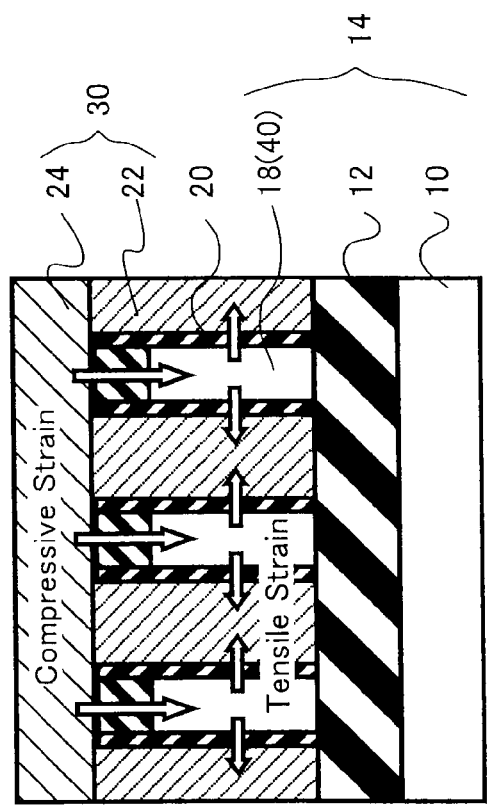
FIG. 32 is a sectional diagram of a semiconductor device of an eighth embodiment.
Figure 32:
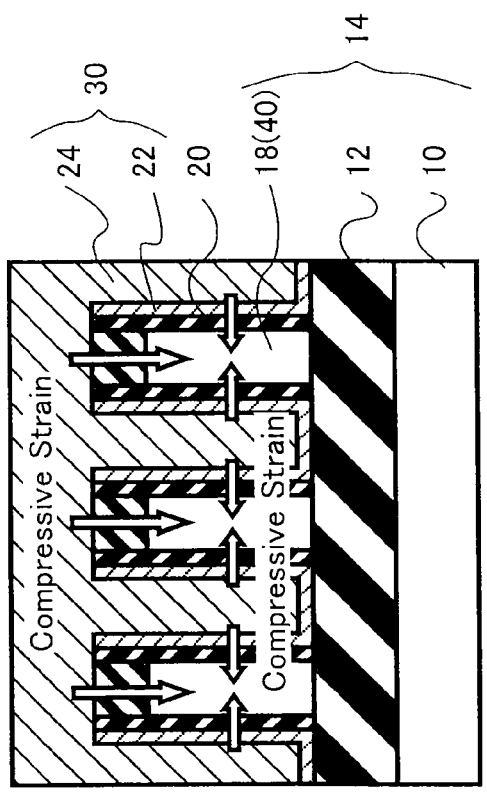

FIG. 32 is a schematic sectional diagram of the complementary semiconductor device of this embodiment. Left part of this diagram shows an n-channel FinFET whereas right part is a p-channel FinFET. The p-channel FinFET is arranged to have the structure of the third embodiment of FIG. 22; the n-channel FinFET has the structure that has been explained in conjunction with FIG. 2.

Concerning the p-channel FinFET, this is arranged so that the lowermost layer of a poly-Si film 24 of gate electrode 30 is placed at a position which is at or above the upper face of a hard mask layer 42. More specifically, it is formed so that a portion between channel regions 18 is filled with a metal film 22. As for the n-channel FinFET, this is formed so that a portion between channel regions 18 is buried with a poly-Si film 24. Additionally, regarding the n-channel FinFET, the impurity concentration in the poly-Si film 22 is almost uniform and is set, for example, to $2 \times 10^{20}$ cm$^{-3}$ or greater and less than or equal to $2 \times 10^{21}$ cm$^{-3}$.

With the use of this structure, the p-channel FinFET is such that the compressive strain that is in the perpendicular direction to the substrate is increased, causing a tensile to be induced in the perpendicular direction to the rectangular semiconductor layer sidefaces. Concerning the n-channel FinFET, compressive strains are induced both in the perpendicular direction to the substrate and in the perpendicular direction to the rectangular semiconductor layer sidefaces. As a result, as apparent from FIGS. 3 and 4, it is possible to improve both the performance of the n-channel FinFET and that of the p-channel FinFET at a time.

Although the FinFETs have been discussed here, similar effects are also obtainable by applying the structure of this embodiment to nanowire transistors.

Ninth Embodiment

A semiconductor device of this embodiment is a complementary semiconductor device which is made up of a p-channel (110) sideface FinFET and an n-channel (110) sideface FinFET. This semiconductor device has a semiconductor substrate, a rectangular shaped semiconductor layer which is formed at an upper part of the semiconductor substrate and which has a top surface that is parallel to a principal plane of the semiconductor substrate and side faces with a (110) plane perpendicular to the semiconductor substrate principal plane, a second rectangular shaped semiconductor layer which is formed at the upper part of the semiconductor substrate and which has a second top surface that is parallel to the principal plane of the semiconductor substrate and second sidefaces with a (110) plane perpendicular to the semiconductor substrate principal plane, a pMISFET, and an nMISFET. The pMISFET has a channel region which is formed at least on a sideface(s) of the rectangular semiconductor layer, a gate insulator film which is formed on sidefaces of the channel region, a gate electrode which is covers the channel region with the gate insulator film being sandwiched therebetween, and a pair of source/drain regions which are formed within the rectangular semiconductor layer in such a way as to interpose the channel region therebetween. The nMISFET has a second channel region which is formed at least on the sideface(s) of the second rectangular semiconductor layer, a second gate insulator film which is formed on the second sidefaces of the second rectangular semiconductor layer, a second gate electrode which covers the second channel region with the second gate insulator film being sandwiched therebetween, and a pair of second source/drain regions which are formed within the second rectangular semiconductor layer in such a manner as to interpose the second channel region therebetween, wherein both a compressive strain that is in the perpendicular direction to the semiconductor substrate principal plane and a tensile strain that is in a direction perpendicular to the second sidefaces are applied to the second channel region.

Figure 33:
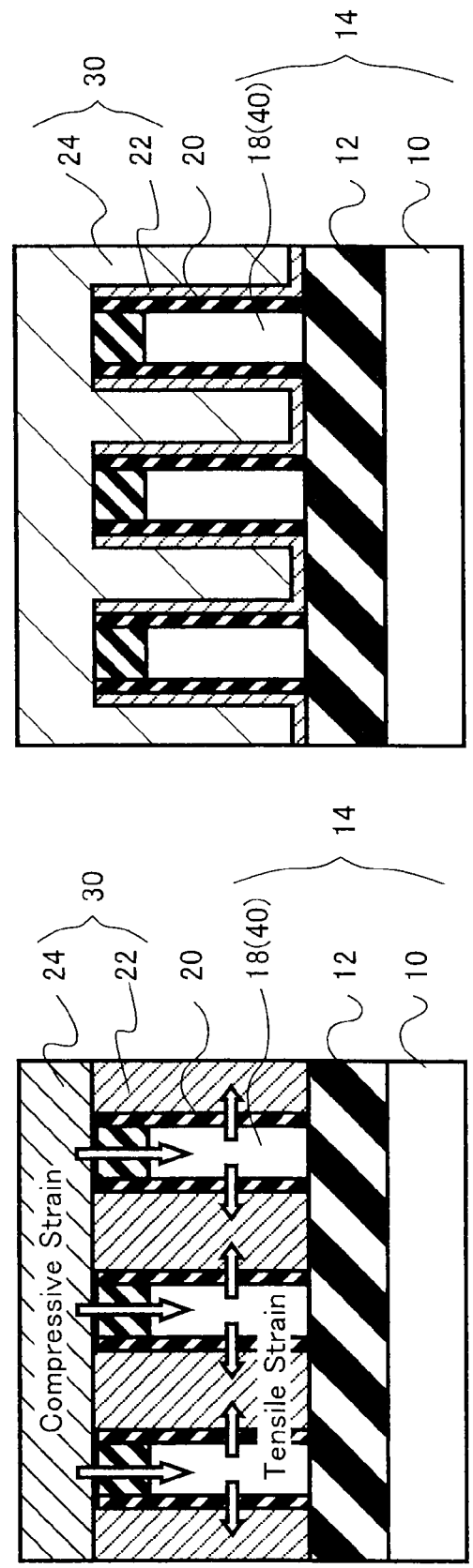
FIG. 33 is a sectional diagram of a semiconductor device of a ninth embodiment.

FIG. 33 is a schematic sectional diagram of the complementary semiconductor device of this embodiment. Left part of this diagram shows an n-channel FinFET, and right part is a p-channel FinFET. The n-channel FinFET is the one that applies the structure of the third embodiment of FIG. 22 to n-channel FinFET.

Regarding the n-channel FinFET, this is arranged so that the lowermost surface of a poly-Si film 24 of gate electrode 30 is at a position at or above the upper surface of a hard mask layer 42. In other words, it is formed so that a portion between channel regions 18 is filled with a metal film 22. Regarding the p-channel FinFET, this is arranged so that a portion between channel regions 18 is buried with a poly-silicon film 24. As for the p-channel FinFET, the impurity concentration in the poly-Si film 24 is made almost uniform and is set at a relatively low level. For example, the impurity concentration is set to $2 \times 10^{19}$ cm$^{-3}$ or more and less than $2 \times 10^{20}$ cm$^{-3}$.

With this the impurity concentration distribution setup, the n-channel FinFET is such that a compressive strain is induced only in the perpendicular direction to the 2) principal plane of the semiconductor substrate (strain amount of 0.05% or greater), and a tensile strain is induced in the perpendicular direction to the sidefaces of the rectangular semiconductor layer (strain amount of 0.05° or more). Regarding the p-channel FinFET, no compressive strains are induced both in the perpendicular direction to the semiconductor substrate principal plane and in the perpendicular direction to the rectangular semiconductor layer sidefaces (strain amount of less than or equal to 0.05%). As a result, it is possible to further improve the performance of the n-channel FinFET while avoiding performance degradation of the p-channel FinFET, as apparent from FIGS. 3 and 4.

Although the invention has been described and illustrated with reference to particular embodiments, the principles involved are susceptible for use in numerous other embodiments, modifications and alterations which will be apparent to persons skilled in the art to which the invention pertains. The invention is, therefore, to be limited only as indicated by the scope of the appended claims, with possible equivalents involved therein.

What is claimed is:

1. A semiconductor device comprising:
a semiconductor substrate;
a first semiconductor layer having a rectangular solid-shape formed at an upper part of the semiconductor substrate to have a first top surface with a (100) plane being parallel to a principal plane of the semiconductor substrate and a first side face with a (100) plane perpendicular to the principal plane of the semiconductor substrate; and
a pMISFET, wherein
the pMISFET has a first channel region formed at least at the first side face of the first semiconductor layer, a first gate dielectric film formed at least on the first side face of the first semiconductor layer, a first gate electrode covering the first channel region with the first gate dielectric film being sandwiched therebetween, and first source/drain regions formed within the rectangular solid-shaped first semiconductor layer in such a way as to interpose the first channel region therebetween,
the first gate electrode includes a metal film and a first semiconductor film having an impurity concentration which becomes higher in a direction from the semiconductor substrate side of the first semiconductor film to an upside thereof,
the first channel region is applied a compressive strain in a direction perpendicular to the principal plane of the semiconductor substrate, and
the metal film is interposed between the first gate dielectric film and the first semiconductor film.

2. The device according to claim 1, further comprising:
a second semiconductor layer having a rectangular solid-shape formed at the upper part of the semiconductor substrate to have a second top surface with a (100) plane being parallel to the principal plane of the semiconductor substrate and a second side surface with a (100) plane perpendicular to the principal plane of the semiconductor substrate; and
an nMISFET, wherein
the nMISFET has a second channel region formed at least at the second side face of the second semiconductor layer, a second gate dielectric film formed at least on the second side face of the second semiconductor layer, a second gate electrode covering the second channel region with the second gate dielectric film being sandwiched therebetween, and second source/drain regions formed within the second rectangular solid-shaped semiconductor layer in such a way as to interpose the second channel region therebetween,
the second gate electrode includes a second semiconductor film having a uniform impurity concentration,
the second channel region is applied a compressive strain in a direction perpendicular to the principal plane of the semiconductor substrate, and
the second channel region is applied a compressive strain in a direction perpendicular to the second side face.

3. The device according to claim 1, wherein the first gate dielectric film is formed only on the first side face of the semiconductor layer.

4. The device according to claim 1, wherein the first gate dielectric film is also formed on the top surface of the first semiconductor layer.

5. The device according to claim 1, wherein the semiconductor substrate is a SOI substrate.

6. The device according to claim 1, wherein the semiconductor substrate is a bulk silicon substrate.

7. The device according to claim 1, wherein the impurity concentration of the first semiconductor film of the first gate electrode is greater than or equal to $2\times10^{19}$ per cubic centimeter ($cm^{-3}$) and less than $2\times10^{20} cm^{-3}$ at a lowermost layer on the semiconductor substrate side of the first semiconductor film and is more than or equal to $2\times10^{20}$ $cm^{-3}$ and less than or equal to $2\times10^{21}$ $cm^{-3}$ at an uppermost layer.

8. A method of manufacturing a semiconductor device having a pMISFET, comprising:
forming a plurality of semiconductor layers having a rectangular solid-shape at an upper part of a semiconductor substrate, the rectangular solid-shape having a top surface with a (100) plane being parallel to a principal plane of the semiconductor substrate and a side face with a (100) plane perpendicular to the principal plane of the semiconductor substrate;
forming a gate dielectric film at least on side faces of the semiconductor layers;
forming a metal film on the gate dielectric film;
depositing a semiconductor film on the metal film in such a way as to fill a portion between adjacent ones of the semiconductor layers;
performing impurity ion implantation to amorphasize an upper part of the semiconductor film;
patterning the semiconductor film and the metal film to thereby form a gate electrode;
forming a stress liner dielectric film on the gate electrode;
performing thermal processing for crystallizing the upper part of the semiconductor film; and
removing the stress liner dielectric film.

9. A method of manufacturing a semiconductor device having a pMISFET, comprising:
forming a plurality of semiconductor layers having a rectangular solid-shape at an upper part of a semiconductor substrate, the rectangular solid-shape having a top surface with a (100) plane being parallel to a principal plane of the semiconductor substrate and a side face with a (100) plane perpendicular to the principal plane of the semiconductor substrate;
forming a gate dielectric film at least at side faces of the semiconductor layers;
forming a metal film on the gate dielectric film in such a way as to fill a portion between adjacent ones of the semiconductor layers;
planarizing the metal film by polishing;
depositing a semiconductor film on the metal film;
performing impurity ion implantation to amorphasize an upper part of the semiconductor film;
patterning the semiconductor film and the metal film to thereby form a gate electrode;
forming a stress liner dielectric film on the gate electrode;
performing thermal processing for crystallizing the upper part of the semiconductor film; and
removing the stress liner dielectric film.

10. A semiconductor device comprising:
a semiconductor substrate;
first semiconductor layers having a rectangular solid-shape formed at an upper part of the semiconductor substrate to have a first top surface with a (100) plane being parallel to a principal plane of the semiconductor substrate and a first side face with a (100) plane perpendicular to the principal plane of the semiconductor substrate; and a pMISFET, wherein
the pMISFET has a first channel region formed at least at the first side face of the first semiconductor layers, a first gate dielectric film formed at least on the first side face of the first semiconductor layers, a first gate electrode covering the first channel region with the first gate dielectric film being sandwiched therebetween, and first source/drain regions formed within the rectangular solid-shaped first semiconductor layers in such a way as to interpose the first channel region therebetween,
the first gate electrode includes a metal film and a first semiconductor film on the metal film,
the metal film fills a portion between adjacent ones of the first semiconductor layers interposing the first gate dielectric film in between the metal film and the first semiconductor layers,
the first semiconductor film has its lowermost surface which is above the first top surface of the first semiconductors layers, and
the first channel region is applied a compressive strain in a direction perpendicular to the principal plane of the semiconductor substrate and the first channel region is applied a tensile strain in a direction perpendicular to the first side face.

11. The device according to claim 10, further comprising:
a second semiconductor layer having a rectangular solid-shape formed at the upper part of the semiconductor substrate to have a second top surface with a (100) plane being parallel to the principal plane of the semiconductor substrate and a second side surface with a (100) plane perpendicular to the principal plane of the semiconductor substrate; and
an nMISFET, wherein
the nMISFET has a second channel region formed at least at the second side face of the second semiconductor layer, a second gate dielectric film formed at least on the second side face of the second semiconductor layer, a second gate electrode covering the second channel region with the second gate dielectric film being sandwiched therebetween, and second source/drain regions formed within the second rectangular solid-shaped semiconductor layer in such a way as to interpose the second channel region therebetween,
the second gate electrode includes a second semiconductor film having a uniform impurity concentration,
the second channel region is applied a compressive strain in a direction perpendicular to the principal plane of the semiconductor substrate, and
the second channel region is applied a compressive strain in a direction perpendicular to the second side face.

12. The device according to claim 11, wherein the second gate electrode includes a second metal film, the second metal film being interposed between the second gate dielectric film and the second semiconductor film.

* * * * *